(12) United States Patent
Yamaguchi

(10) Patent No.: US 7,633,344 B2
(45) Date of Patent: Dec. 15, 2009

(54) LOW NOISE AMPLIFIER AND DIFFERENTIAL AMPLIFIER

(75) Inventor: Kouichiro Yamaguchi, Tokyo (JP)

(73) Assignee: Icom Incorporated (JP)

( * ) Notice: Subject to any disclaimer, the term of this patent is extended or adjusted under 35 U.S.C. 154(b) by 0 days.

(21) Appl. No.: 12/183,857

(22) Filed: Jul. 31, 2008

(65) Prior Publication Data
US 2009/0108937 A1    Apr. 30, 2009

(30) Foreign Application Priority Data
Oct. 31, 2007    (JP)    ............................ 2007-284566

(51) Int. Cl.
*H03F 1/38*    (2006.01)
(52) U.S. Cl. ...................... 330/291; 330/188; 330/260; 330/311
(58) Field of Classification Search .................. 330/75, 330/76, 79, 103, 185, 188, 252, 260, 291, 330/292, 311
See application file for complete search history.

(56) References Cited

U.S. PATENT DOCUMENTS

| | | | |
|---|---|---|---|
| 6,542,037 B2* | 4/2003 | Noll et al. | .................... 330/311 |
| 7,339,432 B2* | 3/2008 | Yamaguchi | .................. 330/252 |
| 7,501,891 B2* | 3/2009 | Yamaguchi | .................. 330/254 |

FOREIGN PATENT DOCUMENTS

JP    2003-289226    10/2003

OTHER PUBLICATIONS

K. Van Hartingsveldt, M.H.L. Kouwenhoven, C.J.M. Verhoeven, and A.N. Burghartz, "HF Low Noise Amplifiers with Integrated Transformer Feedback", ISCAS, May 2002, II815-II818, vol. 2.

* cited by examiner

*Primary Examiner*—Khanh V Nguyen
(74) *Attorney, Agent, or Firm*—Baker & McKenzie LLP

(57) ABSTRACT

In a double-loop negative feedback low noise amplifier having double negative feedback paths by a feedback transformer and a feedback resistor added to a cascode amplifier comprising transistors and a resistor, a phase compensation circuit comprising a capacitor and a resistor is added between the output terminal of the double-loop negative feedback low noise amplifier and the input terminal of the cascode amplifier, i.e., the input terminal of the input transistor, and a phase compensation circuit comprising a capacitor and a resistor is added to the upper-stage transistor of the cascode amplifier, i.e., the input terminal of the upper-stage transistor. Those phase compensation circuits enable a low noise negative feedback amplifier which maintains a high feedback loop gain to a high frequency band, has a wider bandwidth than a conventional one, and has a high dynamic range.

7 Claims, 19 Drawing Sheets

(a) NF (FIRST EMBODIMENT)

(b) S11 (FIRST EMBODIMENT)

(c) S21 (FIRST EMBODIMENT)

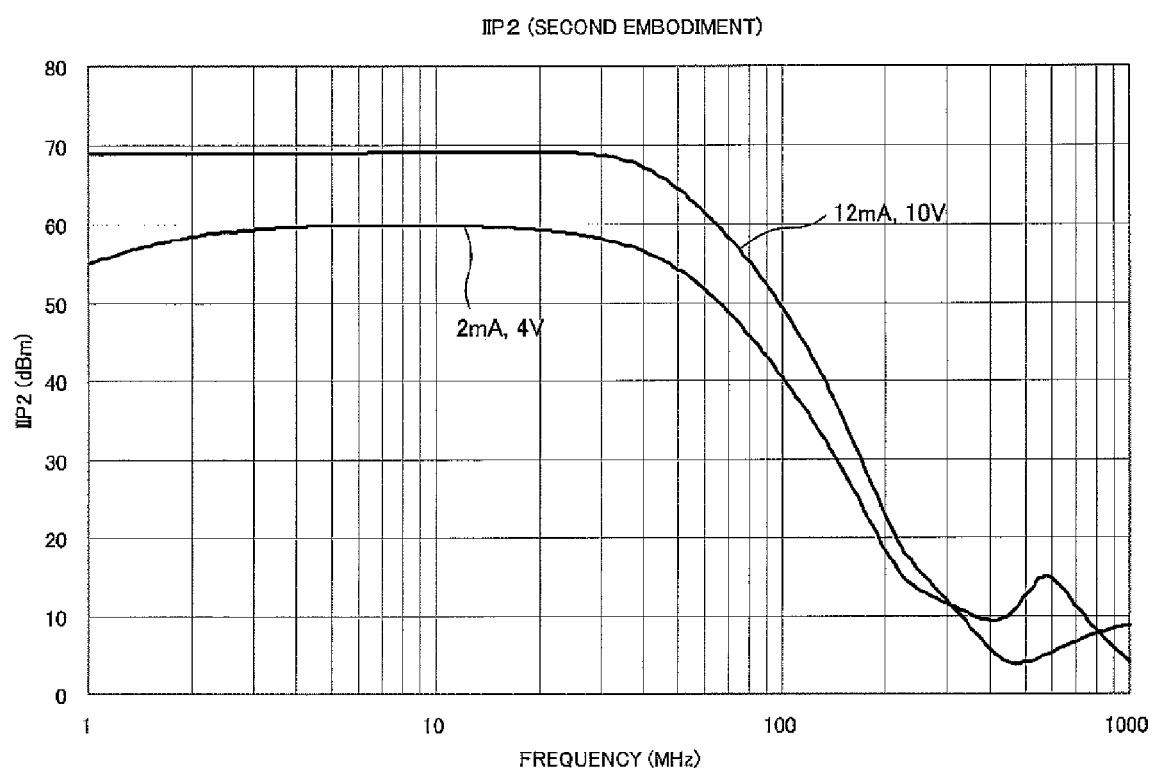

(a) NF (SECOND EMBODIMENT)

(b) S11 (SECOND EMBODIMENT)

(c) S21 (SECOND EMBODIMENT)

FEEDBACK LOOP GAIN (SECOND CONVENTIONAL EXAMPLE)

LOW NOISE AMPLIFIER AND DIFFERENTIAL AMPLIFIER

BACKGROUND OF THE INVENTION

1. Field of the Invention

The present invention relates to a wideband low noise amplifier (LNA) having a high dynamic range and used as an RF amplifier for wireless communication devices, and as an input amplifier for A/D converters.

2. Description of the Related Art

An example of conventional low noise amplifiers is a cascode type amplifier disclosed in Unexamined Japanese Patent Application KOKAI Publication No. 2003-289226. The cascode type amplifier has been known as a type of circuit which is not likely to be affected by the parasitic capacitance of a transistor, and which is suitable for an application to a wideband amplifier.

On the other hand, disclosed in "HF Low Noise Amplifiers with Integrated Transformer Feedback", ISCAS 2002, vol. 2, pp. II-815 to II-818, May, 2002, written by K. van Hartingsveldt, M. H. L. Kouwenhoven, C. J. M. Verhoeven, and A. N. Burghartz is a low noise amplifier circuit having a double-loop negative feedback circuit constituted by a transformer and a resistor. The low noise amplifier circuit having the double-loop negative feedback circuit is a superior circuit which accomplishes a low noise factor, a stable gain, and a good input impedance matching at the same time in a wideband.

It is possible in principle to realize a low noise amplifier having a high dynamic range and operating with low power consumption by causing a Transformer Feedback Cascode LNA (hereinafter, simply called TFC-LNA), constituted by combining the foregoing cascode type low noise amplifier with the foregoing double-loop negative feedback scheme circuit by a transformer and a resistor, to have a high feedback loop gain. However, acquiring a high feedback loop gain and increasing the cut-off frequency of a feedback loop gain transfer function are in a trade-off relationship. Accordingly, if attempting to maintain a high feedback loop gain at a high frequency band, a sufficient phase compensation cannot be achieved in case of applying a conventional compensation method, and oscillation is easily caused, and such an amplifier does not work as an amplifier itself.

Example cases where a conventional phase compensation method is applied to prevent oscillation of the TFC-LNA are a dominant pole compensation method (first conventional example) and a Miller compensation method (second conventional example), both of which are generally used phase compensation methods, and explanations will be given of the respective characteristics thereof.

FIG. 14 is a circuit diagram showing an example of a TFC-LNA 10A where a dominant pole compensation method is applied (first conventional example).

According to the first conventional example, a 10-V direct-current supply voltage Vd1 is applied from a direct-current voltage source DCS, and a transistor having 8 GHz of a transient frequency is used. A signal source 1 having 50Ω of an output impedance is connected to the hot side of a primary winding of a transformer 3 via a direct-current cut-off capacitor 2. A commercially-available transformer whose turn ratio is, for example, 1:2 is used as the transformer 3.

The cold side of the primary winding of the transformer 3 is connected to the base of an NPN transistor 4. The base of the transistor 4 is connected to the positive electrode of a biasing voltage source 5 via a choke coil 6.

The collector of the transistor 4 is connected to the emitter of an NPN transistor 7. The base of the transistor 7 is connected to the positive electrode of a biasing direct-current voltage source 8, and is grounded from the standpoint of an alternate current. The transistor 4 and the transistor 7 are connected together in a cascode manner, thereby constituting a cascode amplifier having a resistor 9 as a load. The collector of the transistor 7 is connected to one end of the resistor 9 which functions as a load for the cascode amplifier. The direct-current supply voltage Vd1 is applied to the other end of the resistor 9.

The node between the resistor 9 and the collector of the transistor 7 functions as an output node of the cascode amplifier where an amplified output voltage signal is output, and is connected to the base of an NPN transistor 10, i.e., the input terminal of an emitter follower. The transistor 10 and a constant current source 18 constitute the emitter follower, and work as an output buffer of the TFC-LNA 10A. The direct-current supply voltage Vd1 is applied to the collector of the transistor 10 from a direct-current voltage source DCS. A phase compensation capacitor 11 is connected between the base of the transistor 10, i.e., the output node of the cascode amplifier and the positive electrode of the direct-current voltage source DCS, i.e., an alternating current reference potential ground, and the load resistor 9 and the capacitor 11 give a dominant pole of a feedback loop gain, and function as a low-pass filter for the output of the cascode amplifier. The emitter of the transistor 10, i.e., the output terminal of the TFC-LNA 10A, is connected to a load 13 of that amplifier via a direct-current cut-off capacitor 12. In the example of FIG. 14, the load 13 comprises a resistor of 5 kΩ.

The cold side of the secondary winding of the transformer 3 is connected to the emitter of the transistor 10, i.e., the output terminal of the TFC-LNA 10A. The hot side of the secondary winding is connected to the ground. An output voltage signal applied to the secondary winding of the transformer 3 is transmitted to the primary side of the transformer 3 by electromagnetic coupling, and is series-mixed with an input signal. This constitutes the first negative feedback path of the TFC-LNA 10A. A resistor 16 and a direct-current cut-off capacitor 17 are connected in series between the emitter of the transistor 10, i.e., the output terminal of the TFC-LNA 10A, and the hot-side terminal of the primary winding of the transformer 3, i.e., the signal input terminal of the TFC-LNA 10A, and function in such a way that an output signal is shunt-mixed with an input signal. This constitutes a second negative feedback path of the TFC-LNA 10A. The emitter of the transistor 10 is connected to, for example, a constant current source 18 to supply an operating current of the emitter follower.

According to the first conventional example, the operating current of the emitter follower is set to approximately 12 mA. Because the cascode amplifier with a voltage gain of 200 (46 dB) is used in the TFC-LNA 10A of the first example, the maximum magnitude of its feedback loop gain becomes over 40 dB.

The voltage gain of the TFC-LNA 10A is theoretically given by the turn ratio N of the transformer 3, and because the turn ratio of the commercially-available transformer used in the first conventional example is 1:2, the voltage gain of the TFC-LNA 10A of the first conventional example is approximately 6 dB. The commercially-available transformer 3 used in the first conventional example is a transformer having a loss of 1.0 dB or so and a pass band between 3 MHz to 200 MHz. The most appropriate resistance of the resistor 16 which serves as a feedback resistor is theoretically given by an equation $(N+1)R$, where R is an input impedance set as a specification of the TFC-LNA 10A and N is a turn ratio of the transformer 3. According to the first conventional example, the input impedance R is set to 50Ω which is a general value, and the resistance of the resistor 16 is 150Ω.

As explained above, the load resistor 9 and the capacitor 11 function as to cause a dominant pole in the transfer function of a feedback loop gain, and the effect thereof results in a phase compensation of the TFC-LNA 10A of the first conventional example. Regarding the TFC-LNA 10A of the first conventional example, in a case where a phase compensation is carried out in such a way that the feedback loop gain measured at the base of the transistor 4 has a phase margin of about 45°, it is necessary for the capacitor 11 to have a capacitance of greater than or equal to 140 pF. It is difficult to form such a large-capacitance capacitor on an integrated circuit in view of a cost limitation, and such capacitor must be an external part. This causes demerits like increments of a part number and a substrate area, and it is a disadvantage of a dominant pole compensation method.

FIG. 15 is a diagram showing the feedback loop gain of the TFC-LNA 10A of the first conventional example in Bode plotting, where a result of measuring the feedback loop gain measured at the base of the transistor 4 in simulation is plotted.

The feedback loop gain of the TFC-LNA 10A of the first conventional example gives the maximum value of about 44 dB around a frequency of 360 kHz, and decreases to 0 dB around a frequency of about 190 MHz. The phase margin is 45°, and the gain margin is about 5 dB. The −3 dB cut-off frequency which indicates a frequency where the feedback loop gain starts decreasing is about 1.1 MHz, and thus it becomes apparent that the band where the TFC-LNA 10A maintains a high dynamic range is merely several MHz or so.

According to the dominant pole compensation method, a compensation is carried out in such a way that the feedback loop gain decreases at −20 dB/dec as the frequency of an input signal increases. The maximum frequency of the pass band where the commercially-available transformer used in the first conventional example works substantially ideally is about 200 MHz, and at a frequency band higher than this, the deterioration of the phase margin due to the parasitic capacitance or the like of the transistor becomes notable, in addition to the attenuation of the phase margin due to dominant pole.

Accordingly, if attempting to have a sufficient phase margin through the foregoing method, it is necessary to set the cut-off frequency low to 200 MHz/2 dec (=100), i.e., less than or equal to 2 MHz in a case where the maximum feedback loop gain is set to a high value greater than or equal to 40 dB like the first conventional example. In this manner, the band where the high feedback loop gain is maintained is limited to a frequency remarkably lower than the transformer-pass-band maximum limit, and the TFC-LNA 10A does not bring out a sufficient performance when used as a high-frequency low noise amplifier. This is another disadvantage when the dominant pole compensation method is used.

FIG. 16 is a diagram showing a simulation result of measuring the third order input intercept point characteristic for the TFC-LNA 10A of the first conventional example (FIG. 14).

In the simulation of the third order input intercept point (hereinafter, IIP3) of the TFC-LNA 10A of the first conventional example (FIG. 14), two tone signals each having power of −50 dBm are used as inputs at a frequency shifted by ±10 kHz around the measured frequency. The axis of abscissas in FIG. 16 represents a frequency (MHz), and the axis of ordinates thereof represents IIP3 (dBm).

As is apparent from FIG. 16, IIP3 deteriorates greater than or equal to 20 dB from the maximum value of 42 dB at 10 MHz. The deterioration of IIP3 is caused in response to the attenuation of the feedback loop gain of the TFC-LNA 10A shown in FIG. 15. In general, according to a negative feedback amplifier, as the feedback loop gain thereof decreases, the value of IIP3 decreases together. As explained above, according to the TFC-LNA 10A where the dominant pole compensation method is applied, it is difficult to maintain a high feedback loop gain at a high frequency band, so that the circuit of the first conventional example is not suitable for a high-frequency low noise amplifier that a good distortion characteristic, i.e., a high dynamic range is required.

Next, an explanation will be given of an example case where a phase compensation using a Miller compensation method is applied to a TFC-LNA as a second conventional example.

FIG. 17 is a circuit diagram showing an example where a phase compensation using a Miller compensation method is applied to a TFC-LNA (second conventional example).

A TFC-LNA 10B of the second conventional example is a circuit where a Miller compensation method is applied to a TFC-LNA, having the same specifications (direct-current supply voltage Vd1=10 V, voltage gain=6 dB, and input impedance=50Ω) as those of the TFC-LNA 10A of the first conventional example, in lieu of a dominant pole compensation method. That is, in the TFC-LNA 10B of the second conventional example, all elements other than a phase compensation capacitor 19, and voltage sources and a current source have common circuit constants to those of the TFC-LNA 10A of the first conventional example, and the same transistor having a transient frequency of 8 GHz is used.

While according to the first conventional example, the phase compensation capacitor 11 is connected between the output node of the cascode amplifier, i.e., the collector of the transistor 7, and the alternating current ground, according to the second conventional example, however, the phase compensation capacitor 19 is connected between the output node of the cascode amplifier and the input node of the cascode amplifier, i.e., the base of the transistor 4. Let us suppose that the capacitance of the phase compensation capacitor 19 is C and the voltage amplification degree of the cascode amplifier is β, then, the phase compensation capacitor 19 connected in a Miller compensation manner functions as to have an approximately same effectiveness as that of a case where a shunt capacitor having a capacitance of (β−1)C is connected to the input node of the cascode amplifier. Accordingly, in general, in the Miller compensation method, it is possible to perform a phase compensation using a capacitor of a smaller capacitance in comparison with the dominant pole compensation method.

FIG. 18 is a diagram where the feedback loop gain of the TFC-LNA 10B of the second conventional example is indicated in Bode plotting, and where a result of measuring the feedback loop gain measured at the base of the transistor 4 in simulation is plotted.

As shown in FIG. 18, the decrement of the loop gain becomes suddenly gradual from around 550 MHz. This indicates that the TFC-LNA 10B starts operating in such a way that the capacitor 19 feeds forward a signal around that frequency, i.e., a signal applied to the input node of the cascode amplifier is transmitted to the base of the emitter follower transistor 10 passing through the capacitor 19. This corresponds to the fact that a zero is formed in the input-output transfer function of the TFC-LNA 10B, due to the presence of an additional signal path from the input to the output through the capacitor 19. Accordingly, the cross over frequency of the feedback loop gain becomes higher, making it difficult to maintain the phase margin greater than 0°. Furthermore, because the feedback loop gain attenuates at a sharp inclination of about −60 dB/dec between 200 to 500 MHz, the phase attenuation inclination becomes precipitous around this band.

In a case where the capacitance of the capacitor 19 is increased to a further larger value, and the cut-off frequency of the feedback loop gain is lowered to do phase compensation, the capacitor 19 starts operating in the feed forward direction at a frequency lower than 550 MHz, and the attenuation inclination of the feedback loop gain becomes gradual, so that the cross point frequency does not sufficiently decreases, resulting in destabilization of the TFC-LNA. In other words, it is difficult to obtain sufficient phase margin by increasing the capacitance of the capacitor 19 so that the cut-off frequency of the feedback loop gain is lowered enough, because the frequency of the zero in the input-output transfer function caused by the capacitor 19 is also lowered simultaneously, offsetting the decrease of the cross over frequency of the feedback loop gain. It is possible to prevent the cross over frequency from becoming high by decreasing the feedback loop gain, but the IIP3 characteristic of the amplifier also deteriorates simultaneously due to the reduction of the feedback amount of the amplifier. Because of the foregoing reason, it is difficult to realize a phase compensation for a TFC-LNA having a high dynamic range by the Miller compensation method.

SUMMARY OF THE INVENTION

A low noise amplifier according to the first aspect of the invention comprises:

a transformer having a primary winding whose one end is connected to a signal input terminal to which an input signal is applied, and a secondary winding electromagnetically coupled to the primary winding;

an input-stage transistor having a control electrode, a first conduction electrode and a second conduction electrode, the first and second conduction electrodes changing a conduction state by the control electrode, and the control electrode being connected to a terminal of the primary winding other than the terminal connected to the signal input terminal;

an upper-stage transistor having a control electrode, a first conduction electrode and a second conduction electrode, the first and second conduction electrodes changing a conduction state by the control electrode, the second conduction electrode being connected to a load device, and the first conduction electrode being connected to the second conduction electrode of the input-stage transistor so that the upper-stage transistor is connected to the input-stage transistor in a cascode connection manner, thereby enhancing an output impedance;

an amplification-result transmission circuit providing an amplification result of the input signal to an output node;

a first negative feedback circuit applying an amplification result of the input signal on the output node to the secondary winding;

a second negative feedback circuit connected between the output node and the signal input terminal;

a first phase compensation circuit connected to the output node and the control electrode of the upper-stage transistor; and a second phase compensation circuit connected to the output node and the control electrode of the input-stage transistor.

The amplification-result transmission circuit may have an emitter follower or a source follower connected to the second conduction electrode of the upper-stage transistor, and a signal output from the emitter follower or the source follower may be applied to the output node as an amplification result of the input signal.

The low noise amplifier may further comprise a consumption current adjustment unit which supplies a variable current flowing to the emitter follower or the source follower.

A differential amplifier according to the second aspect of the invention comprises:

a first transformer having a primary winding whose one end is connected to a first signal input terminal to which a first input signal is applied, and a secondary winding electromagnetically coupled to the primary winding;

a first input-stage transistor having a control electrode, a first conduction electrode and a second conduction electrode, the first and second conduction electrodes changing a conduction state by the control electrode, and the control electrode being connected to a terminal of the primary winding of the first transformer other than the terminal connected to the first signal input terminal;

a first upper-stage transistor having a control electrode, a first conduction electrode and a second conduction electrode, the first and second conduction electrodes changing a conduction state by the control electrode, the second conduction electrode being connected to a first load device, and the first conduction electrode being connected to the second conduction electrode of the first input-stage transistor so that the first upper-stage transistor is connected to the first input-stage transistor in a cascode connection manner, thereby enhancing an output impedance;

a first amplification-result transmission circuit providing an amplification result of the first input signal to a first output node;

a first negative feedback circuit applying an amplification result of the first input signal on the first output node to the secondary winding of the first transformer;

a second negative feedback circuit connected between the first output node and the first signal input terminal;

a second transformer having a primary winding whose one end is connected to a second signal input terminal to which a second input signal is applied, and a secondary winding electromagnetically coupled to the primary winding;

a second input-stage transistor having a control electrode, a first conduction electrode and a second conduction electrode, the first and second conduction electrodes changing a conduction state by the control electrode, and the control electrode being connected to a terminal of the primary winding of the second transformer other than the terminal connected to the second signal input terminal;

a second upper-stage transistor having a control electrode, a first conduction electrode and a second conduction electrode, the first and second conduction electrodes changing a conduction state by the control electrode, the second conduction electrode being connected to a second load device, and the first conduction electrode being connected to the second conduction electrode of the second input-stage transistor so that the second upper-stage transistor is connected to the second input-stage transistor in a cascode connection manner, thereby enhancing an output impedance;

a second amplification-result transmission circuit providing an amplification result of the second input signal to a second output node;

a third negative feedback circuit applying an amplification result of the second input signal on the second output node to the secondary winding of the second transformer;

a fourth negative feedback circuit connected between the second output node and the second signal input terminal;

a constant current circuit connected to a current path, including the first input-stage transistor, the first upper-stage transistor and the first load device, and a current path, including the second input-stage transistor, the second upper-stage transistor, and the second load device;

a first phase compensation circuit connected to the first output node and the control electrode of the first upper-stage transistor;

a second phase compensation circuit connected to the first output node and the control electrode of the first input-stage transistor;

a third phase compensation circuit connected to the second output node and the control electrode of the second upper-stage transistor; and a fourth phase compensation circuit connected to the second output node and the control electrode of the second input-stage transistor.

The first amplification-result transmission circuit may have a first emitter follower or a first source follower connected to the second conduction electrode of the first upper-stage transistor, and a signal output from the first emitter follower or the first source follower may be applied to the first output node as an amplification result of the first input signal, and the second amplification-result transmission circuit may have a second emitter follower or a second source follower connected to the second conduction electrode of the second upper-stage transistor, and a signal output from the second emitter follower or the second source follower may be applied to the second output node as an amplification result of the second input signal.

The differential amplifier may further comprise a consumption current adjustment unit which supplies a variable current flowing to the first emitter follower or the first source follower, and a variable current flowing to the second emitter follower or the second source follower.

A low noise amplifier according to the third aspect of the invention comprises:

a signal input terminal to which an input signal is applied;

a transformer having a primary winding whose one end is grounded, and a secondary winding electromagnetically coupled to the primary winding;

an input-stage transistor having a control electrode, a first conduction electrode, and a second conduction electrode, the first and second conduction electrodes changing a conduction state by the control electrode, the control electrode being connected to the signal input terminal, and the first conduction electrode being connected to a terminal of the primary winding other than the terminal grounded;

an upper-stage transistor having a control electrode, a first conduction electrode and a second conduction electrode, the first and second conduction electrodes changing a conduction state by the control electrode, the second conduction electrode being connected to a load device, the first conduction electrode being connected to the second conduction electrode of the input-stage transistor so that the upper-stage transistor is connected to the input-stage transistor in a cascode connection manner, thereby enhancing an output impedance;

an amplification-result transmission circuit providing an amplification result of the input signal to an output node;

a first negative feedback circuit applying an amplification result of the input signal on the output node to the secondary winding;

a second negative feedback circuit connected between the output node and the control electrode of the input-stage transistor;

a first phase compensation circuit connected to the output node and the control electrode of the upper-stage transistor; and a second phase compensation circuit connected to the output node and the control electrode of the input-stage transistor.

BRIEF DESCRIPTION OF THE DRAWINGS

The object and other objects and advantages of the present invention will become more apparent upon reading of the following detailed description and the accompanying drawings in which:

FIG. 9 is a diagram showing a simulation result of an IIP2 characteristic for the TFC-LNA of the second embodiment;

DETAILED DESCRIPTION OF THE PREFERRED EMBODIMENTS

Embodiments of the invention will be explained in detail with reference to the accompanying drawings.

First Embodiment

Figure 1:
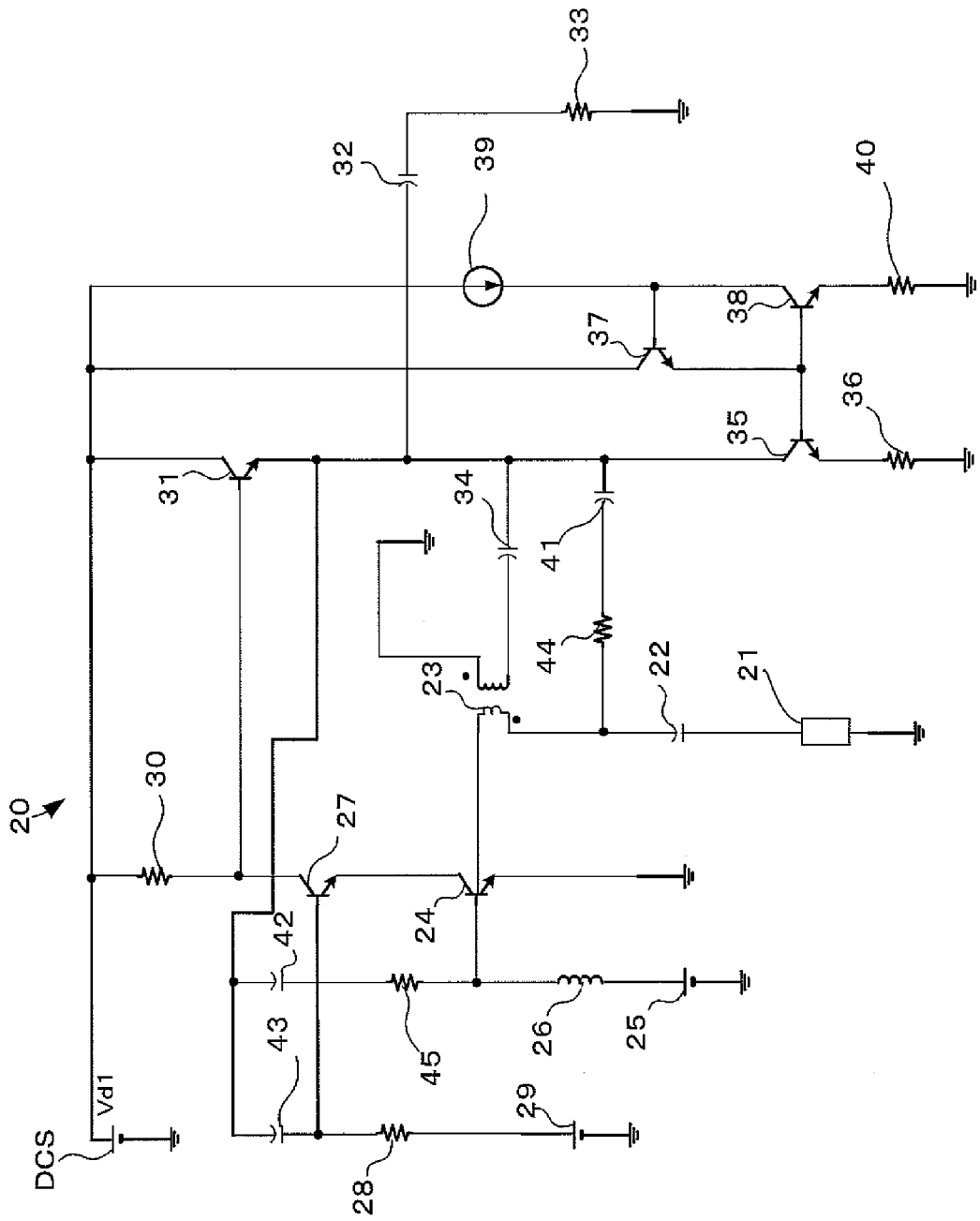
FIG. 1 is a circuit diagram showing a TFC-LNA according to the first embodiment of the invention.

FIG. 1 is a circuit diagram showing a TFC-LNA 20 according to the first embodiment of the invention.

A 10-V direct-current supply voltage Vd1 is applied to the TFC-LNA 20 from a direct-current voltage source DCS, and transistors each of which has a transient frequency of 8 GHz are used.

A signal source 21 having an output impedance R of 50Ω is connected to the hot side of the primary winding of a transformer 23 through a coupling capacitor 22. A commercially-available transformer whose turn ratio is 1:2 is used as the transformer 23.

The cold side of the primary winding of the transformer 23 is connected to the base of an NPN transistor 24 which serves as an input-stage transistor of a cascode connection. The base of the transistor 24 is further connected to the positive electrode of a biasing voltage source 25 through a choke coil 26.

The collector of the transistor 24 is connected to the emitter of an NPN transistor 27 which serves as an upper-stage transistor of the cascode connection. The base of the transistor 27 is connected to the positive electrode of a biasing voltage source 29 through a phase compensation resistor 28. The resistor 28 works together with a capacitor 43 to be discussed later, and constitutes a first phase compensation circuit of the first embodiment. The negative electrode of the biasing power source 29 is grounded.

The transistor 24 and transistor 27 are connected together in a cascode connection manner, and constitute a cascode amplifier having a resistor 30 as a load. The collector of the transistor 27 is connected to one end of the resistor 30 which functions as a load device of the cascode amplifier. The other end of the resistor 30 is connected to the direct-current voltage source DCS, and the direct-current supply voltage Vd1 is applied thereto.

The node between the resistor 30 and the collector of the transistor 27 serves as an output node where an amplified output signal of the cascode amplifier is output, and is connected to the base of an NPN transistor 31, i.e., the input terminal of an emitter follower. The transistor 31 and a constant current source (transistor 35) constitute the emitter follower, and operate as an output buffer of the TFC-LNA 20.

The collector of the transistor 31 is connected to the direct-current voltage source DCS. The emitter of the transistor 31 functions as an output terminal of the TFC-LNA 20, and is connected to a resistor 33 of, for example, 5 kΩ which serves as a load through a coupling capacitor 32. The output terminal of the TFC-LNA 20, i.e., the emitter of the transistor 31 is connected to the cold side of the secondary winding of the transformer 23 through a coupling capacitor 34. An output voltage signal applied to the secondary winding of the transformer 23 is transmitted to the primary side of the transformer 23 by electromagnetic coupling, and is series-mixed with an input signal. This constitutes a first negative feedback path of the TFC-LNA 20.

The emitter of the transistor 31 is connected to the collector of an NPN transistor 35, and the emitter of the transistor 35 is grounded through a resistor 36. The base of the transistor 35 is connected to the emitter of an NPN transistor 37 and the base of an NPN transistor 38. The collector of the transistor 37 is connected to the direct-current voltage source DCS, so that the direct-current supply voltage Vd1 is applied thereto from the direct-current voltage source DCS. The base of the transistor 37 and the collector of the transistor 38 are connected to a direct-current source 39, and the transistors 35, 37, and 38 constitute a current mirror.

The emitter of the transistor 38 is grounded through a resistor 40. The same parts are used for the transistor 35 and the transistor 38, and, the resistor 36 and the resistor 40, and the current ratio of the current mirror is 1:1. The direct-current source 39 is set as to have a current value of 12 mA, and supplies an operating current for the transistor 31 which constitutes the emitter follower.

The emitter of the transistor 31 which serves as the output terminal of the TFC-LNA 20 is further connected to one electrode of a coupling capacitor 41, one electrode of a phase compensation capacitor 42, and one electrode of a phase compensation capacitor 43.

The other electrode of the capacitor 41 is connected to one end of a resistor 44, and the capacitor 41 works as a coupling capacitor. The other end of the resistor 44 is connected to a signal input terminal of the TFC-LNA 20, and the resistor 44 functions in such a way that an output signal is shunt-mixed with an input signal. This constitutes a second negative feedback path of the TFC-LNA 20.

The other electrode of the capacitor 42 is connected to the base of the transistor 24 through a phase compensation resistor 45. The capacitor 42 and the resistor 45 constitute a second phase compensation circuit of the first embodiment.

The other electrode of the capacitor 43 is connected to the transistor 27. As explained above, the capacitor 43 and the resistor 28 constitute the first phase compensation circuit of the first embodiment.

The TFC-LNA 20 of the first embodiment is a TFC-LNA having the same specifications as those of the first conventional example and the second conventional example (direct-current supply voltage Vd1=10 V, voltage gain=6 dB, and input impedance=50Ω), and performing a new phase compensation by the first and second phase compensation circuits. Likewise the TFC-LNA 10A of the first conventional example and the TFC-LNA 10B of the second conventional example, the cascode amplifier of the TFC-LNA 20 of the first embodiment has a voltage amplification degree of about 46 dB, and an operating voltage of 12 mA is applied to the emitter follower.

An explanation will be given of the characteristic of the TFC-LNA 20 shown in FIG. 1.

Let us suppose that the transformer 23 of the TFC-LNA 20 shown in FIG. 1 is an ideal transformer having a turn ratio of 1:2, then the transfer function T(s) of a feedback loop gain measured at the base of the transistor 24 can be represented by the following equation (1) using a simple model.

[Equation 1] (1)

$$\begin{cases} T(s) = g_{m1} R_L \dfrac{g_p + \dfrac{3}{2} g_{fb} + \dfrac{1}{2}}{g_p + g_{fb} + g_s} \dfrac{g_s(1 + sC_c R_c)\left(1 - s\dfrac{C_b}{g_{m1}}\right)}{1 + s\dfrac{1}{Q\omega_0} + s^2 \dfrac{1}{\omega_0^2}} \\ \dfrac{1}{Q\omega_0} = C_c R_c + \dfrac{C_b}{g_{m2}}\left(1 + \dfrac{g_{m1} + g_{m2}}{g_p + g_{fb} + g_s}\right) \\ \dfrac{1}{\omega_0^2} = C_c R_c \dfrac{C_b}{g_{m2}}\left(1 + g_{m2} R_L + \dfrac{g_{m1} + g_{m2} + g_{m1} g_{m2} R_L}{g_p + g_{fb} + g_{gs}}\right) \end{cases}$$

-continued $$\text{where } g_{fb} = \frac{1}{R_{fb}} \cdot g_s = \frac{1}{R_s}, g_p = \frac{sC_p}{1+sC_pR_p}$$

where $g_{m1}$ is the transconductance of the transistor 24, $g_{m2}$ is the transconductance of the transistor 27, $C_b$ is the parasitic capacitance value between the base and collector of the transistor 24, $C_c$ is the capacitance value of the capacitor 43, $R_c$ is the resistance value of the resistor 28, $C_p$ is the capacitance value of the capacitor 42, $R_p$ is the resistance value of the resistor 45, $R_{fb}$ is the resistance value of the resistor 44, $R_L$ is the resistance value of the resistor 30, and $R_s$ is the output impedance value of the signal source 21.

In a case where there is no phase compensation by the resistor 45 and the capacitor 42, i.e., in a case where $g_p=0$, the transfer function T(s) of the feedback loop gain becomes a simple quadratic expression, and a zero is generated at a point which is given by $s=-1/(C_c \cdot R_c)$. Another zero of T(s) is present in the right half plane of s, but it does not really affect to a frequency region where the feedback loop gain is greater than or equal to 1.

Near a frequency given by $\omega_{z1}=1/(C_c \cdot R_c)$, there is a part where the attenuation of a phase is reduced by the effect of the zero, so that the phase margin at a cross over frequency where the feedback loop gain becomes 1 increases, thereby stabilizing the TFC-LNA 20.

In this manner, it is basically possible to cause the TFC-LNA 20 to stably operate by using only the first phase compensation circuit, i.e., the resistor 28 and the capacitor 43 only, without the second phase compensation circuit to be discussed later, but in practice, because the elements and the transformer 23 used in the TFC-LNA 20 have various parasitic capacitances, parasitic inductances, a sufficient phase margin cannot be held in some cases. Accordingly, in this embodiment, the second phase compensation circuit, i.e., the capacitor 42 and the resistor 45 are added to further increase the phase margin.

At this time, there is generated a zero near a frequency given by $\omega_{z2}=1/(C_p \cdot R_p)$, and there is an effect of increasing the phase of the feedback loop gain, so that it becomes possible to further increase the phase margin in comparison with a case where only the first phase compensation circuit, i.e., the resistor 28 and the capacitors 43 only are used.

Figure 2:
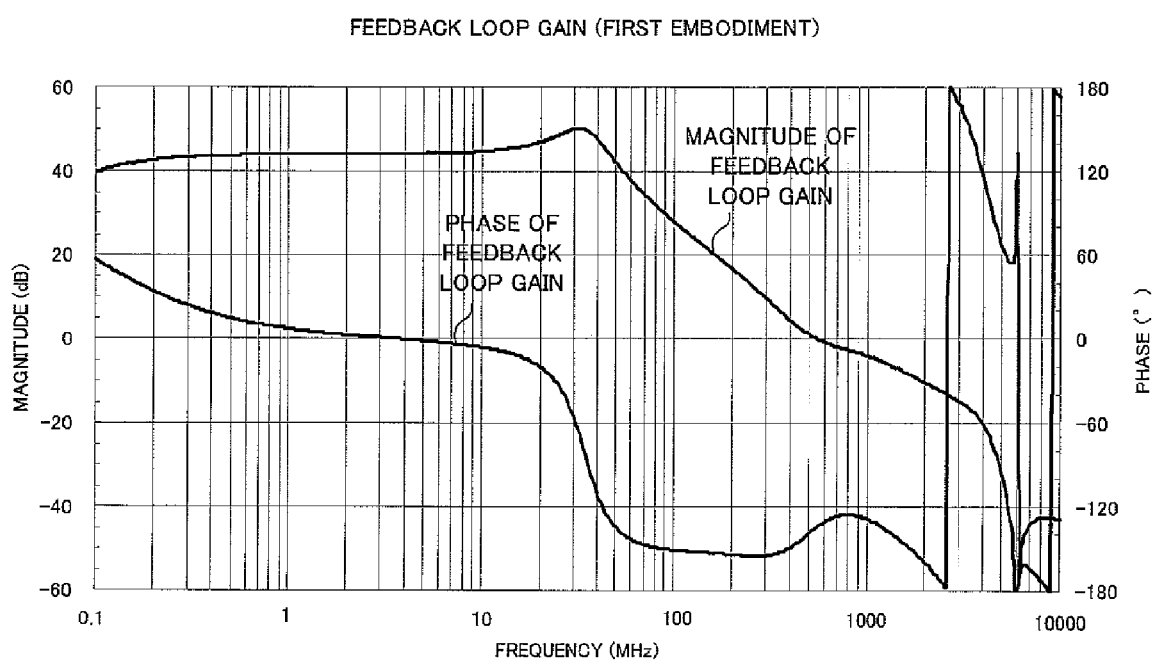
FIG. 2 is a diagram showing a simulation result of the feedback loop gain for the TFC-LNA of the first embodiment.

FIG. 2 is a diagram showing the feedback loop gain of the TFC-LNA 20 of the first embodiment (see, FIG. 1) as a Bode plot, and a measuring result of the feedback loop gain measured at the base of the transistor 24 in simulation is plotted.

The TFC-LNA 20 of the first embodiment has characteristics such that the maximum absolute value of the feedback loop gain (value at a region where the feedback loop gain becomes almost constant with frequency at a low frequency band) is about 45 dB, the −3 dB cut-off frequency is about 50 MHz, and the cross over frequency where the feedback loop gain becomes 0 dB is about 550 MHz. The phase margin which represents the stability of the TFC-LNA 20 is 45°, and the gain margin is about 13 dB.

In acquiring the foregoing $\omega_{z1}$ from the circuit constant of the first phase compensation circuit of the TFC-LNA 20 of the first embodiment, it becomes about 130 MHz. Likewise, in acquiring the foregoing $\omega_{z2}$ from the circuit constant of the second phase compensation circuit, it becomes about 710 MHz.

Figure 14:
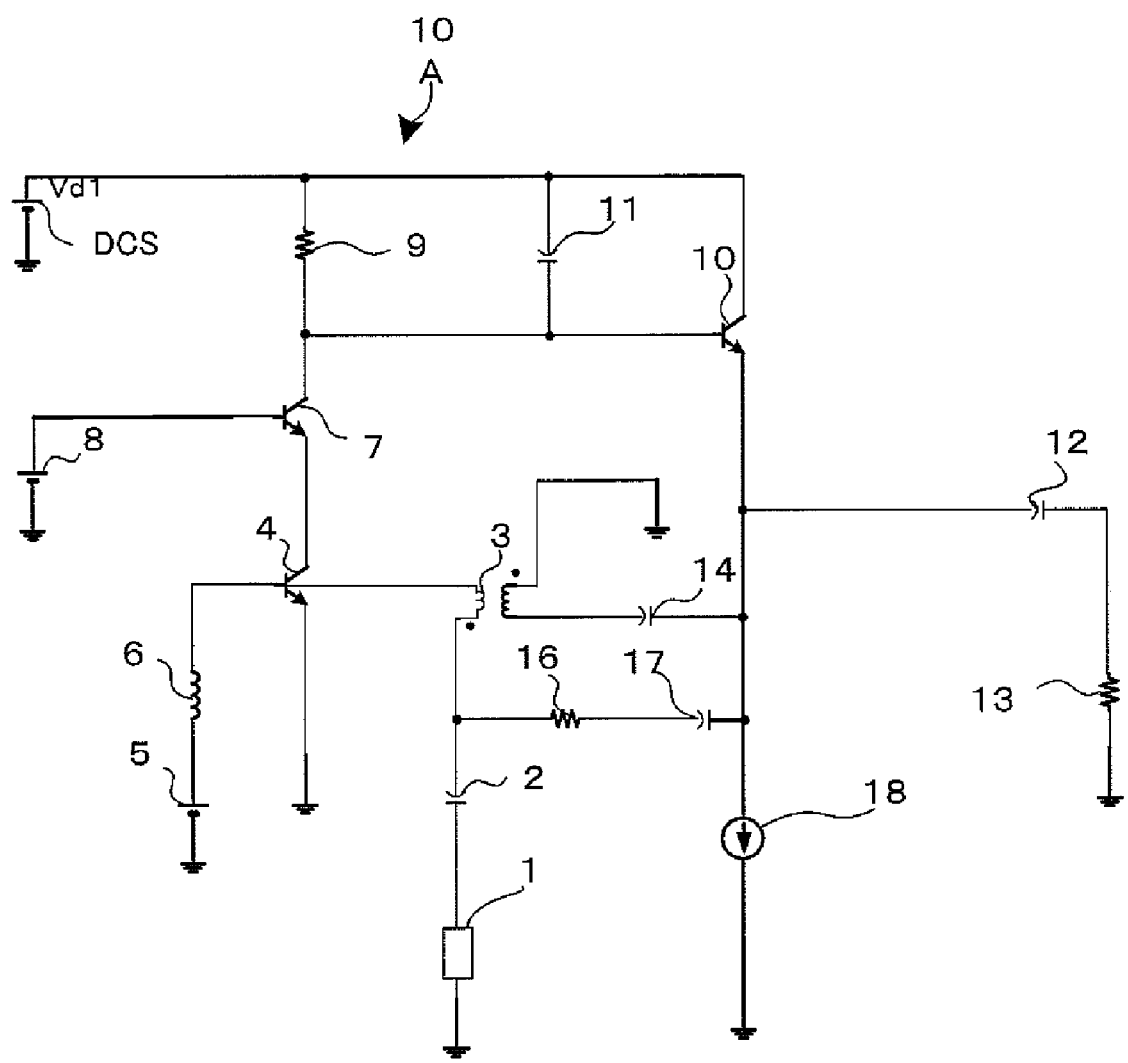
FIG. 14 is a circuit diagram showing an example of a TFC-LNA where a dominant pole compensation method, which is a conventional phase compensation method, is applied.
Figure 15:
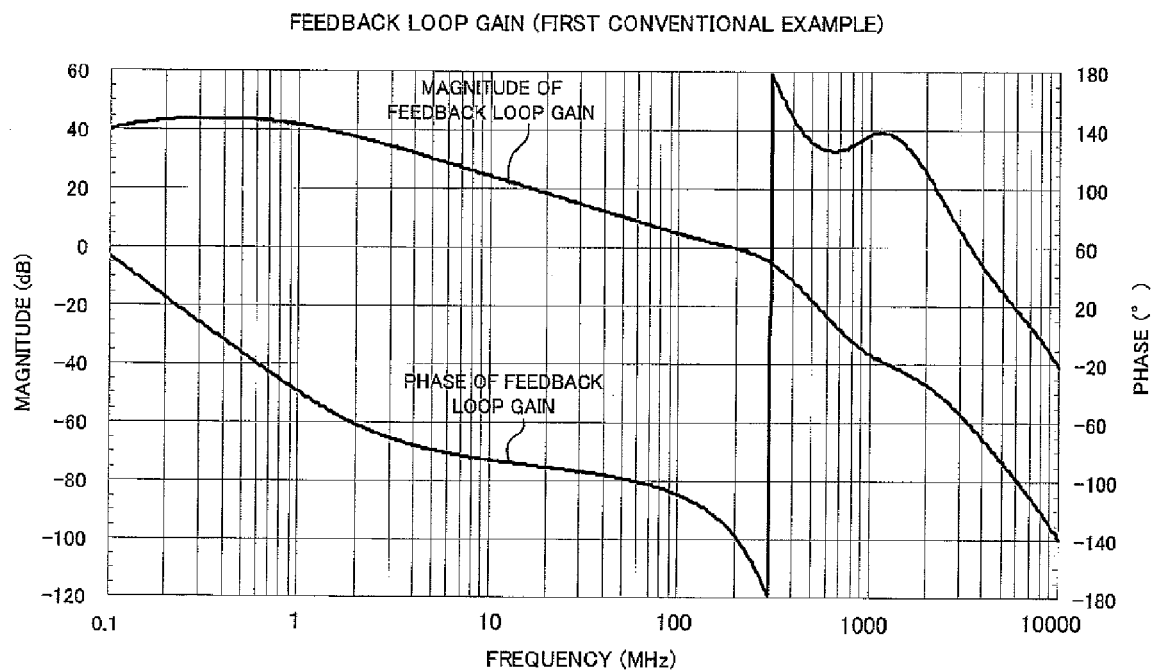
FIG. 15 is a diagram showing a feedback loop gain for a TFC-LNA of the first conventional example.
Figure 16:
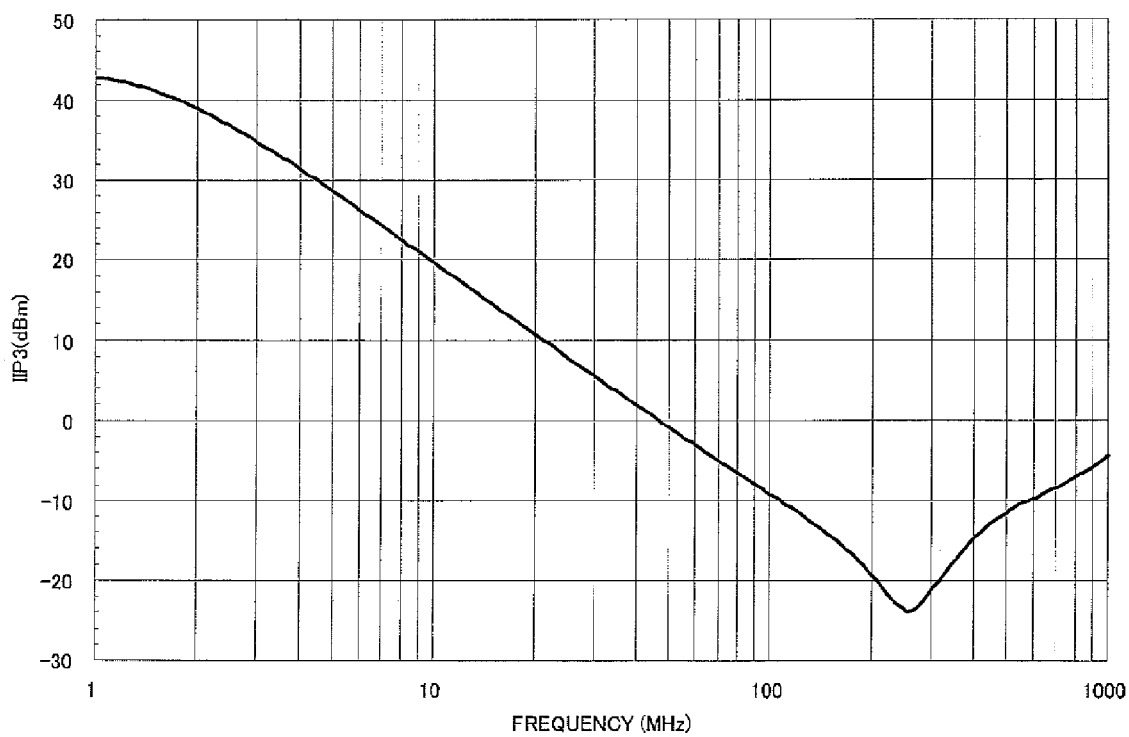
FIG. 16 is a diagram showing a simulation result of an IIP3 characteristic for the TFC-LNA of the first conventional example.
Figure 17:
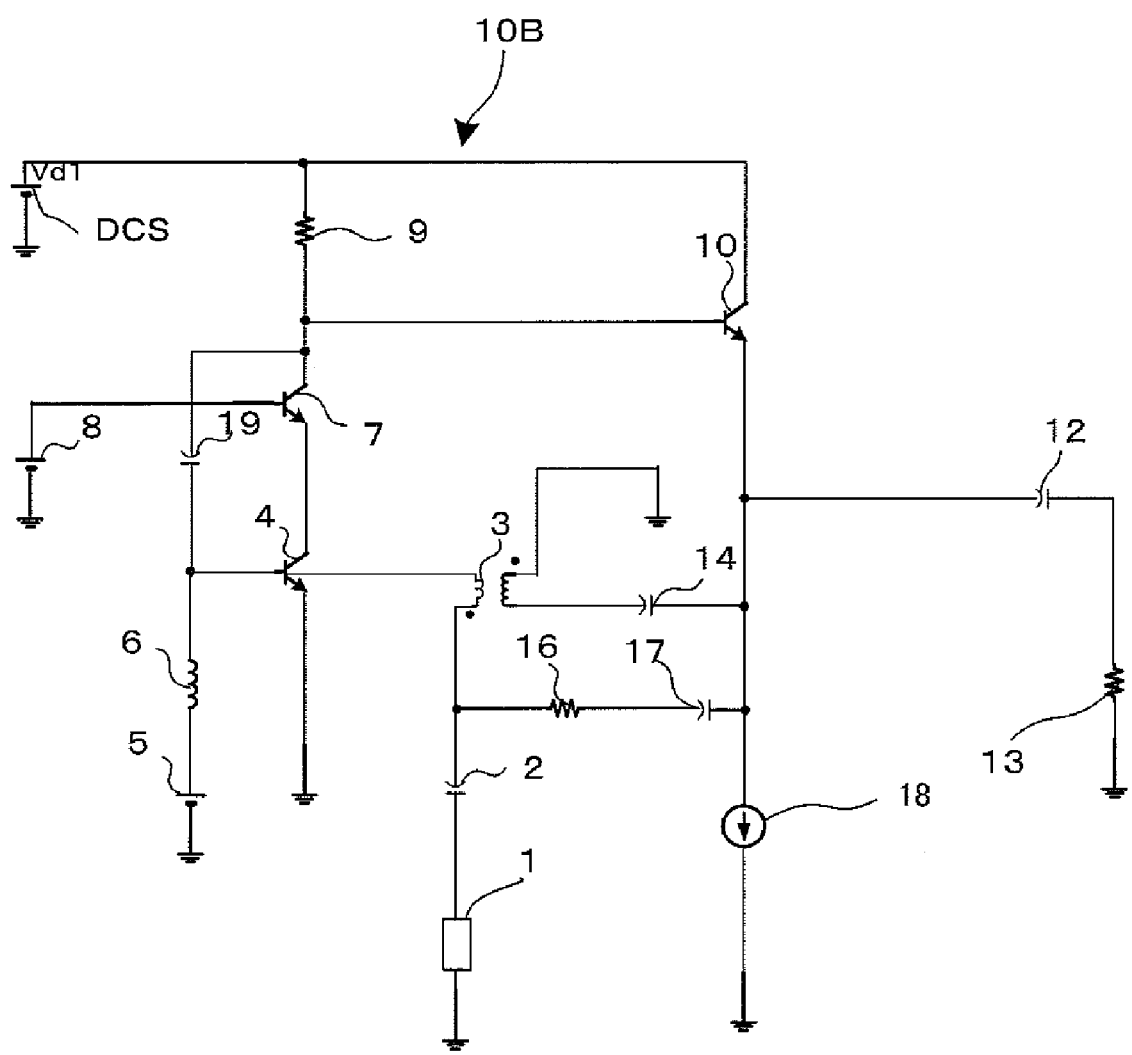
FIG. 17 is a circuit diagram showing a TFC-LNA where the Miller compensation method, which is a conventional phase compensation method, is applied.
Figure 18:
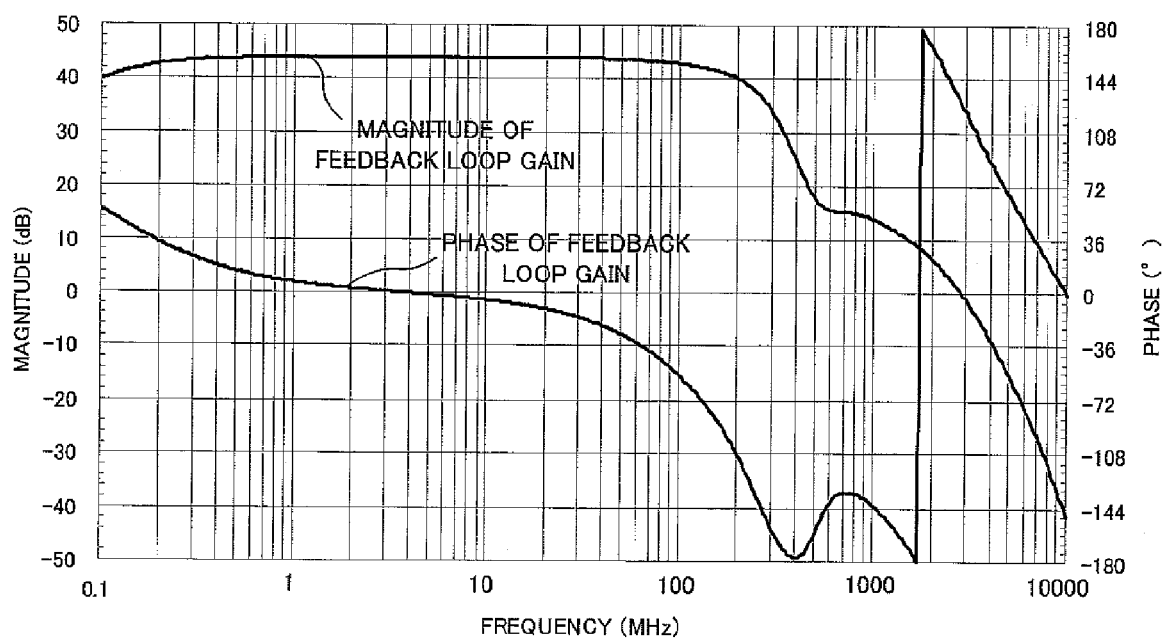
FIG. 18 is a diagram showing a feedback loop gain for the TFC-LNA of the second conventional example.

In comparison with the TFC-LNA 10A of the first conventional example (see, FIG. 14) which performs a compensation by a dominant pole compensation method, according to the first embodiment (see, FIG. 1), the TFC-LNA 20, which has the same stability as that of the first conventional example, and which can maintain a high feedback loop gain up to a higher frequency, is realized using a phase compensation capacitor which has a small capacity and which can be integrated together.

Next, the working and effectiveness of the embodiment will be explained with simulation results.

Figure 3A:
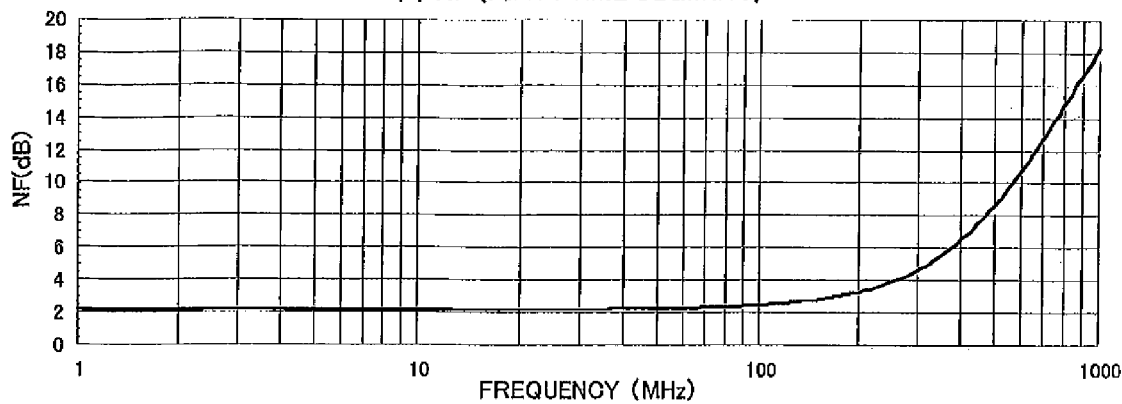
FIGS. 3A, 3B and 3C are diagrams showing simulation results of a noise factor (NF), a reflection coefficient ($S_{11}$), and a permeability coefficient ($S_{21}$) for the TFC-LNA of the first embodiment.
Figure 3B:
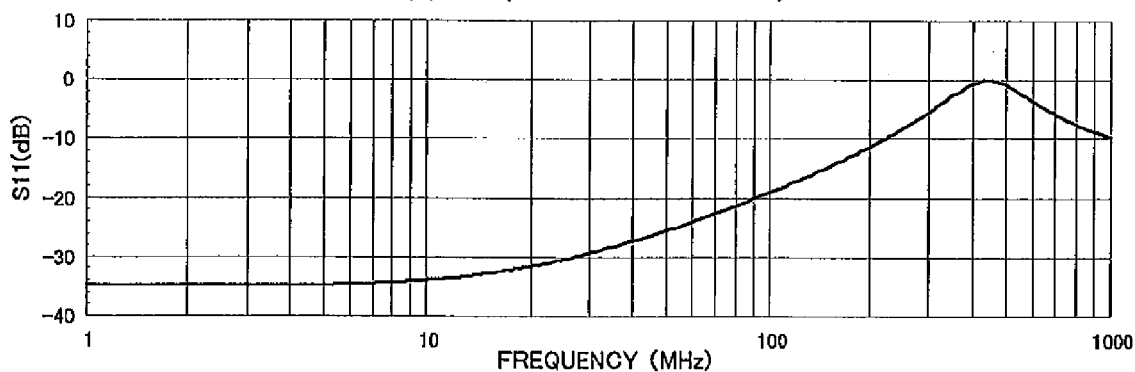
Figure 3C:
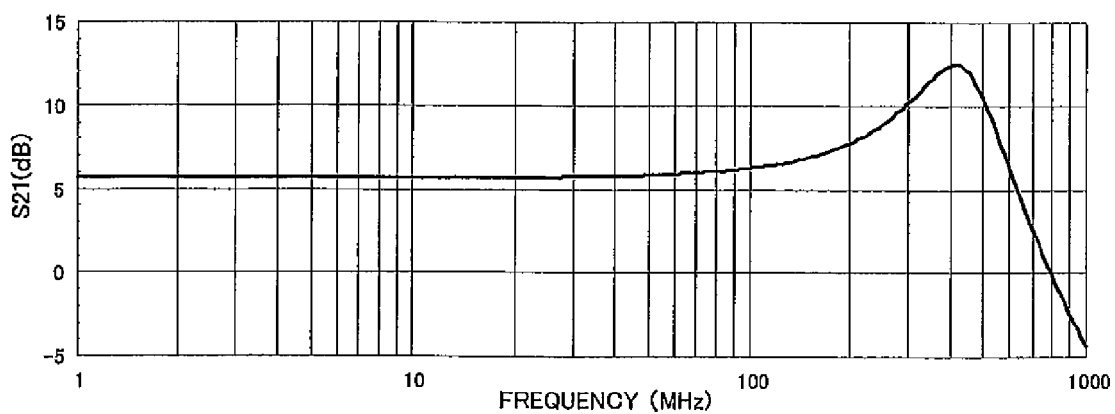

FIGS. 3A to 3C are diagrams respectively showing simulation results of the noise factor (NF), reflection coefficient ($S_{11}$) and permeability coefficient ($S_{21}$) of the TFC-LNA 20 shown in FIG. 1.

According to the TFC-LNA 20 of the first embodiment (FIG. 1), as shown in FIGS. 3A to 3C, sufficient $S_{11}$ and NF and stable $S_{21}$ are acquired around roughly 200 MHz, and it is apparent that the TFC-LNA 20 can operate at a wideband.

Figure 4:
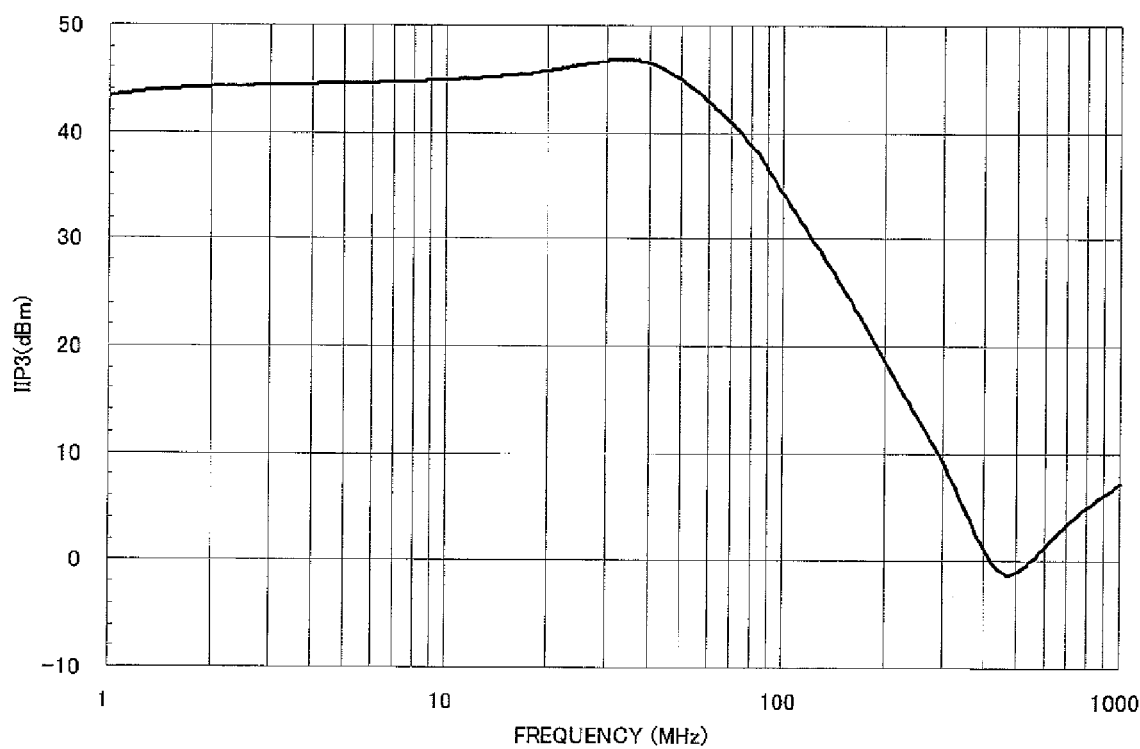
FIG. 4 is a diagram showing a simulation result of an IIP3 characteristic for the TFC-LNA of the first embodiment.

FIG. 4 is a diagram showing a result of simulating a third order input intercept point (IIP3) characteristic of the TFC-LNA 20 of the first embodiment (see, FIG. 1), wherein the axis of abscissas represents a frequency (MHz) and the axis of ordinates represents an IIP3 (dBm), respectively.

In the simulation of the IIP3 characteristic of the TFC-LNA 20 of the first embodiment (FIG. 1), two tone signals each having power of −50 dBm at a frequency shifted by ±10 kHz around a measurement frequency are used as input signals. As is shown in FIG. 4, IIP3 values greater than or equal to +40 dBm are acquired at a band less than or equal to 75 MHz, and IIP3 values greater than or equal to about 19 dBm are acquired at a band less than or equal to 200 MHz, and it becomes apparent that the first embodiment realizes a TFC-LNA which has a low third order distortion characteristic over a wideband.

Figure 5:
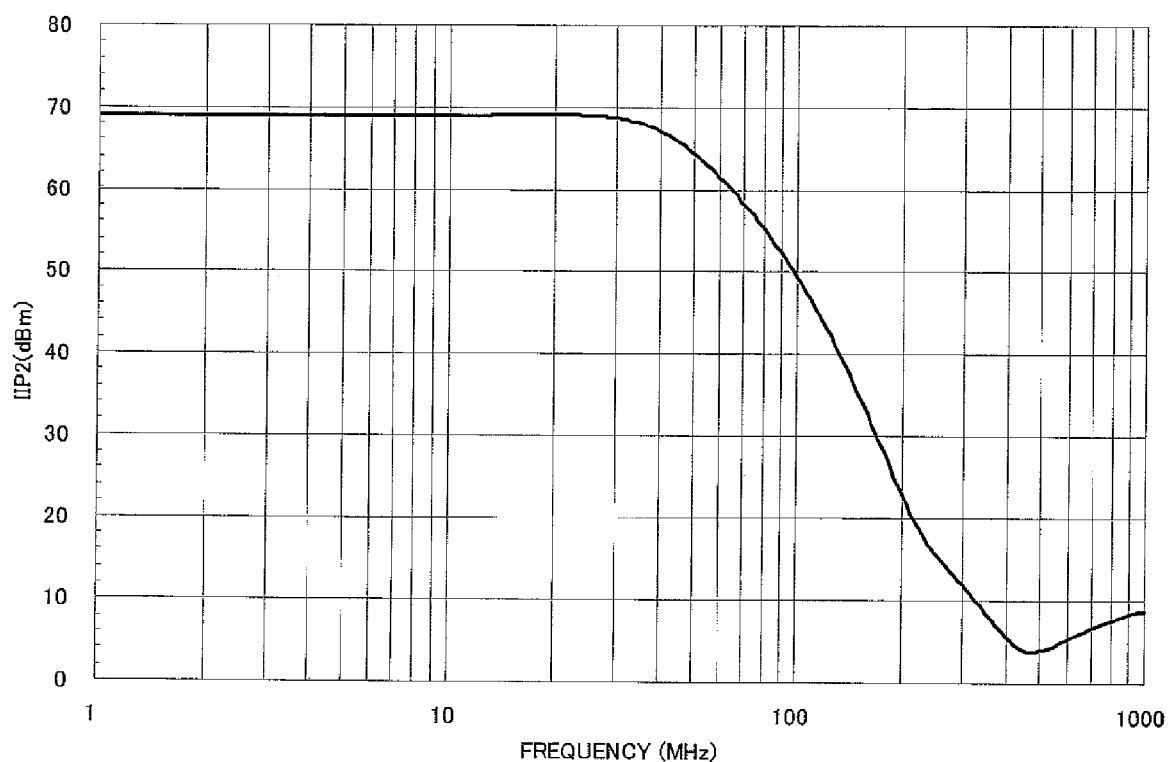
FIG. 5 is a diagram showing a simulation result of an IIP2 characteristic for the TFC-LNA of the first embodiment.

FIG. 5 is a diagram showing a result of simulating the second order input intercept point (IIP2) characteristic of the TFC-LNA 20 of the first embodiment (FIG. 1), wherein the axis of abscissas represents a frequency (MHz) and the axis of ordinates represents an IIP2 (dBm), respectively.

In the simulation of the IIP2 of the TFC-LNA 20 of the first embodiment (FIG. 1), two tone signals having the same specifications as those of the case of measuring the IIP3 characteristic are used as input signals. As shown in FIG. 5, IIP2 values greater than or equal to +60 dBm are acquired at a band less than or equal to 60 MHz, and IIP2 values greater than or equal to about +50 dBm are acquired at a band less than or equal to 100 MHz, and it is apparent that the first embodiment realizes a TFC-LNA which has a low second order distortion characteristic over a wideband.

Figure 6:
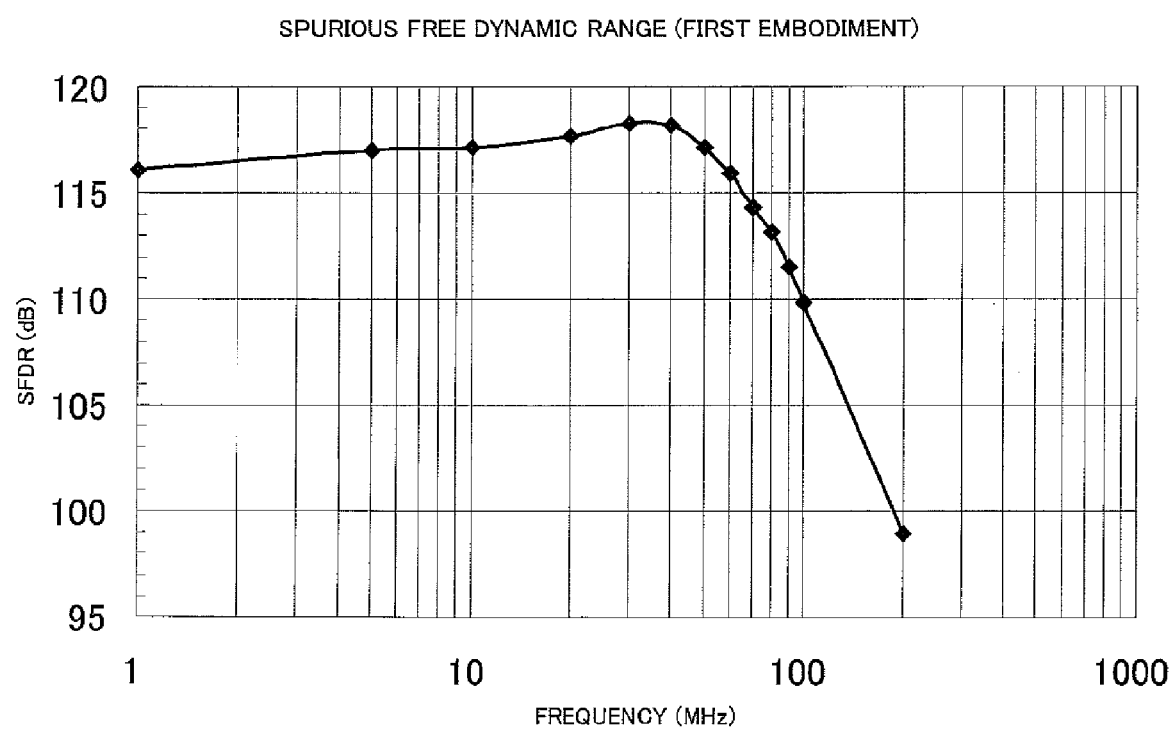
FIG. 6 is a diagram showing a calculation result of a SFDR characteristic for the TFC-LNA of the first embodiment.

FIG. 6 is a diagram showing a result of calculating a spurious-free-dynamic-range (hereinafter, "SFDR") characteristic for the TFC-LNA 20 of the first embodiment (FIG. 1) using the NF value (see, FIG. 3A) and the IIP3 value (see, FIG. 4).

The SFDR characteristic (FIG. 6) of the TFC-LNA 20 of the first embodiment (FIG. 1) is calculated for bands of 1 MHz to 200 MHz while assuming that the bandwidth of a reception signal is 12.5 kHz, and an environmental temperature is 300 K. As shown in FIG. 6, SFDR values greater than or equal to about 100 dB are acquired at a band less than or equal to 200 MHz, and it is apparent that the first embodiment realizes a TFC-LNA which has a high dynamic range at a wideband.

As explained above, the gain of the TFC-LNA 20 is decided based on the turn ratio N of the transformer 23, but the maximum turn ratio of a commercially-available high-frequency wideband transformer is 1:4 or so. Accordingly, if such a transformer is used for realizing the TFC-LNA, the realistic maximum gain of the TFC-LNA 20 is limited to a value less than or equal to 12 dB or so. In considering a case where a high dynamic range is accomplished by a receiver overall, the higher the gain of the TFC-LNA 20 is, the higher the IIP3 required for the mixer of the following stage becomes.

In general, improving the IIP3 characteristic means increasing a power consumption, and, to accomplish a predetermined dynamic range while minimizing a power consumption of the receiver system overall, it is necessary to balance the power consumption of the low noise amplifier and that of the mixer, i.e., the IIP3 values. If the gain of the low noise amplifier is too high, such a balancing in the receiver system is not accomplished at all. This means that the power consumption of the receiver system overall is not optimized, and is not desirable in some cases.

Accordingly, for the application of the embodiment where a high dynamic range is required, the difficulty that the turn ratio of the transformer 23 cannot be increased over 1:4 does not become a serious disadvantage in using the TFC-LNA 20.

In a case where the transformer 23 is one using a core material in practice, the linearity of the amplifier becomes bad in comparison with an ideal case due to the non-linearity, hysteresis, saturation, and the like of the core. This becomes more apparent as a reduction of a P1 dB value representing the distortion characteristic of the amplifier in inputting a large-power signal, rather than the IIP3 value representing the distortion characteristic of the amplifier in inputting a small-power signal.

Second Embodiment

Figure 7:
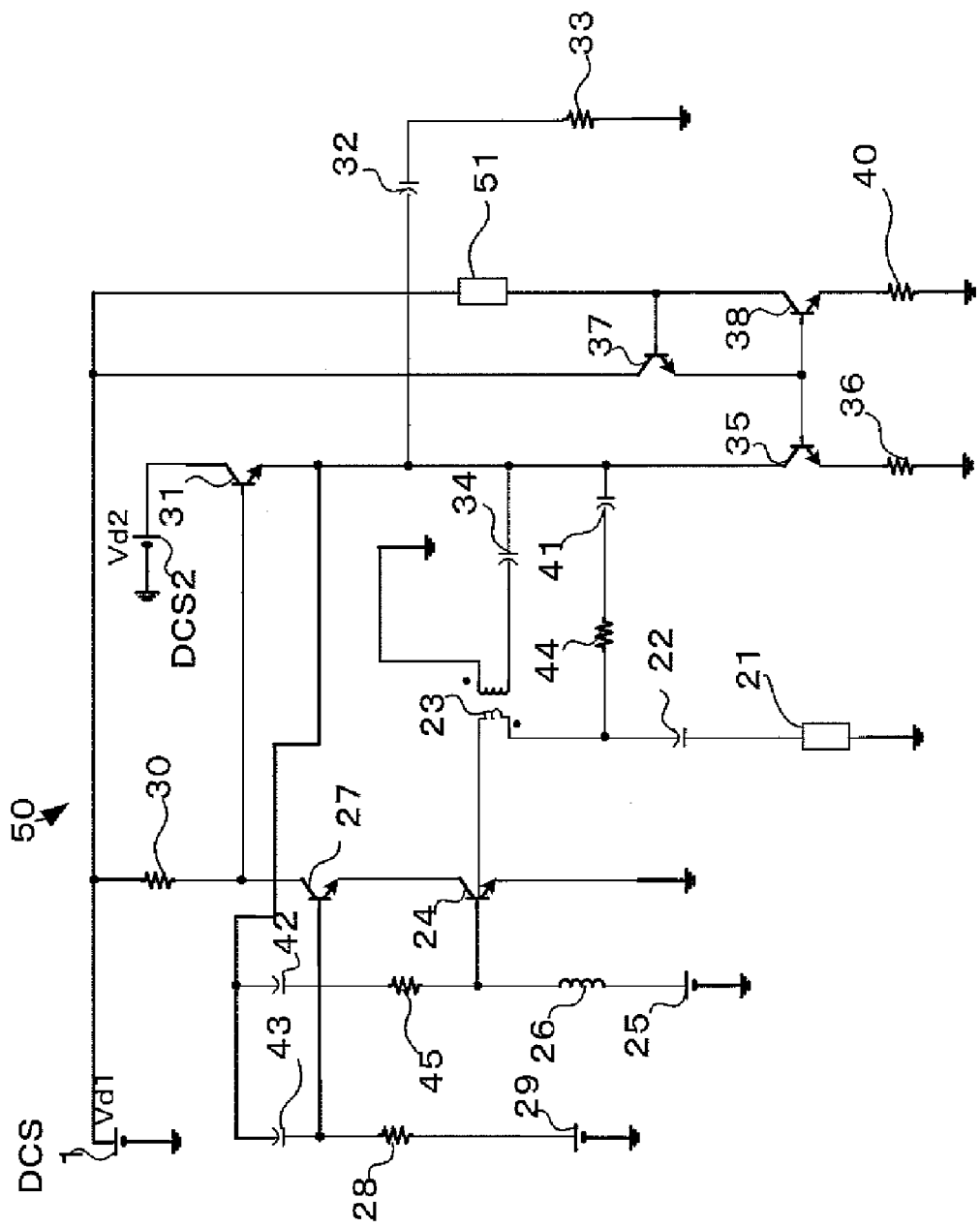
FIG. 7 is a circuit diagram showing a TFC-LNA according to the second embodiment of the invention.

FIG. 7 is a circuit diagram showing a TFC-LNA 50 according to the second embodiment of the invention.

In the TFC-LNA 50 of the embodiment, the direct-current source 39 of the first embodiment is replaced with a variable current source 51, and the collector of emitter follower transistor 31 is connected to a variable voltage source DCS2 having Vd2 as its output voltage, instead of the voltage source DCS1. Every other structural portion remains same as those of the TFC-LNA 20 of the first embodiment.

According to the TFC-LNA 20 of the first embodiment, an operating current of about 12 mA is applied to the emitter follower which is the output buffer of the TFC-LNA 20 because of the necessity of realizing a high dynamic range. Because the 10-V direct-current supply voltage Vd1 is applied to the TFC-LNA 20, the output buffer consumes power of 120 mW. Such a 120-mW power consumption is small in comparison with the overall power consumption of a fixed radio device, so that it does not become a problem, but in case of general battery-operated devices, it is not negligible from the standpoint of a battery duration.

In a case where a battery-operated receiver having a TFC-LNA with a high dynamic range is operated for a long time, in general, a reception environment dynamically changes due to a movement of a disturbing wave source or the like, so that in a period when the receiver is being operated, there is a period when the signal intensity of a disturbing wave is relatively weak, and sufficient demodulation/reception are possible using a low noise amplifier having a low dynamic range.

Therefore, it is not necessary to always use a TFC-LNA having a high dynamic range, and it is apparent that sufficient demodulation/reception can be performed successively even if a dynamic range is dynamically increased and decreased in accordance with the reception environment. In general, the dynamic range of a low noise amplifier simply increases with respect to a power consumption thereof, so that by increasing or decreasing the dynamic range of the TFC-LNA dynamically, the total watt-hour consumption can be reduced in operating the receiver, thereby elongating the battery duration in comparison with a case where the receiver is always used with a high dynamic range.

In case that the power consumption of the TFC-LNA is changed dynamically to achieve an appropriate IIP3 characteristic for each instant, for performing a satisfactory task of reception, it is desirable to keep the frequency characteristic of other small-signal properties thereof, such as an input impedance matching, noise figure, and gain undeteriorated, irrespective of consumed power.

Because all of those small-signal properties mentioned above depend on the feedback loop gain of the TFC-LNA, they will not be deteriorated, if the power consumption of the TFC-LNA is increased or decreased without affecting the frequency characteristic of the feedback loop gain thereof.

On the contrary, if the frequency characteristic of the feedback loop gain depends on the consumed power of the TFC-LNA, it will be necessary to be able to change the circuit constant of a compensation circuit proposed herein, by using switches or some other measures that are difficult to implement or are prohibitively costly, to stabilize the TFC-LNA, in accordance with its dynamically changing power consumption.

In general, the emitter follower constituted by the transistor 31 changes its distortion characteristic, while leaving its small-signal characteristic almost intact, when the power consumption thereof is varied. Therefore, by changing the power consumption of the emitter follower only while maintaining the current of the cascode amplifier part constituted by the transistors 24, 27, unchanged, it becomes possible to increase or decrease the IIP3 of the TFC-LNA while maintaining the frequency characteristic of the feedback loop gain of the TFC-LNA.

To change the power consumption of the emitter follower, increasing or decreasing the power-source voltage (collector voltage) of the transistor 31 of the emitter follower, and increasing or decreasing the current (collector current of the transistor 35) of a constant current source connected to the emitter of the transistor 31 can be considered. In the TFC-LNA 50 of the second embodiment, the collector voltage of the transistor 31 is controlled by the variable voltage source DCS2, while the operating current thereof is controlled by the variable current source 51. Because the distortion characteristic of an emitter follower largely depends on its operating current rather than its collector voltage, it may be allowed to use a fixed voltage source instead of a variable voltage source as DCS2, in some cases.

For implementing the variable voltage source DCS2 and the variable current source 51, one may use a successively variable type, or a discretely variable type, in accordance with a given design specification.

As the direct current output from the variable current source 51 of the TFC-LNA 50 as well as the output voltage of the variable voltage source DCS2 are changed to 2 mA and 4 V from 12 mA and 10 V, which are the operating current and the collector voltage value of the emitter follower of the TFC-LNA 20 of the first embodiment respectively, the power consumption of the emitter follower is reduced from 120 mW to 8 mW, so that a power consumption of 112 mW is saved in comparison with the TFC-LNA 20 of the first embodiment.

Figure 8:
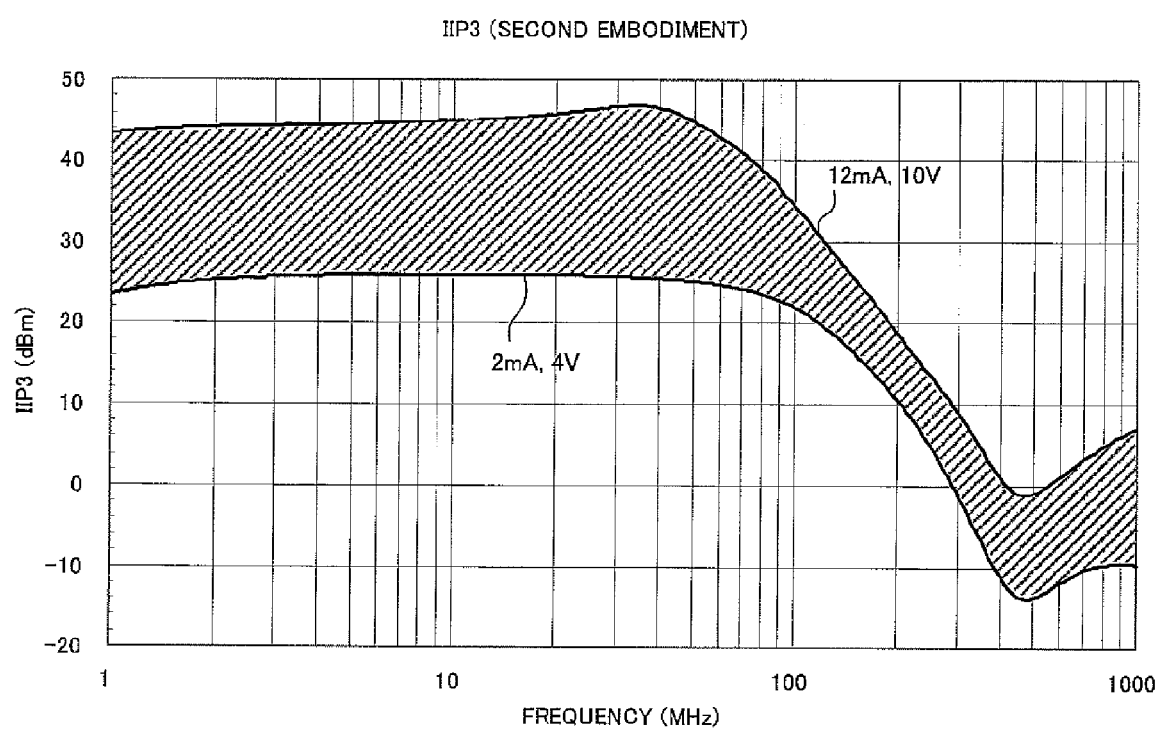
FIG. 8 is a diagram showing a simulation result of an IIP3 characteristic for the TFC-LNA of the second embodiment.

FIG. 8 is a diagram showing a result of simulating the IIP3 characteristic of the TFC-LNA 50 of the second embodiment (FIG. 7), wherein the axis of abscissas represents a frequency (MHz), and the axis of ordinates represents an IIP3 (dBm), respectively.

In the simulation of the IIP3 characteristic of the TFC-LNA 50 of the second embodiment (FIG. 7), a direct current output from the variable current source 51 is set to 2 mA, while the output voltage of the voltage source DCS2 is set to 4 V, and two tone signals each having power of −50 dBm at a frequency shifted by ±10 kHz around a measured frequency are used as input signals. As shown in the simulation result of FIG. 8, IIP3 values greater than or equal to +20 dBm are acquired at a band less than or equal to 100 MHz, and IIP3 values greater than or equal to +10 dBm are acquired at a band less than or equal to 200 MHz.

The low noise amplifier having an IIP3 of +10 dBm or so is normally used in a general receiver system, and the IIP3 characteristic of the TFC-LNA 50 shown in FIG. 8 is not particularly bad, and is sufficient for a practical receiver.

FIG. 8 also shows a result of simulating the IIP3 characteristic of the TFC-LNA 50 when the direct current output from the variable current source 51 as well as the output voltage of the voltage source DCS2 is set to 12 mA and 10 V, respectively, together with the IIP3 characteristic when they are set to 2 mA and 4 V, respectively. The TFC-LNA 50 can be set in such a manner as to become an operation state having an arbitrary IIP3 value in a shaded region sandwiched between two IIP3 characteristic curves in FIG. 8 by changing the output current of the variable current source 51 between 2 mA and 12 mA, and the output voltage of the voltage source DCS2 between 4 V and 10 V, in a continuous or stepwise manner. For example, at a point of 10 MHz, the IIP3 of the TFC-LNA 50 can be increased or decreased within a range between +45 dBm and +25 dBm. As will be discussed later, the output current value of the variable current source 51 as well as the output voltage of the voltage source DCS2 hardly affect to the noise factor characteristic of the TFC-LNA 50, and this means that only the maximum limit of the dynamic range of the TFC-LNA 50 can be controlled by the output current of the variable current source 51 and the output voltage of the voltage source DCS2.

In practice, to use the TFC-LNA 50 effectively in a receiver system and to accomplish a reduction of a power consumption, it is necessary to dynamically set an appropriate dynamic range, i.e., an appropriate output current value of the variable current source 51 as well as an appropriate output voltage of the variable voltage source DCS2 for the TFC-LNA 50 at each instant, in accordance with a dynamically varying reception state. This means that the receiver in which the TFC-LNA 50 is implemented should be equipped with a measure of measuring a state of reception at each instant. In case of a receiver for digitally modulated signals, a state of reception could be defined as a combination of a bit error rate, signal levels at the desired channel, at the first-adjacent channel, and at the second-adjacent channel, all of which may be relatively easily detected by an ordinary receiver. It is possible to estimate a desirable output value to be set to the variable current source 51 as well as the variable voltage source DCS2 in accordance with a specific state of reception, by preparing a table or a function to convert those measured values into the minimum output values for the variable current source 51 and for the variable voltage source DCS2, to achieve satisfactory demodulation with a specified S/N ratio. By repeatedly executing above mentioned measuring-and-fix procedure at certain time interval, the power consumption of the TFC-LNA 50 is always kept at the lowest level without impairing the quality of demodulation, thereby enabling it to work with a lower watt-hour in comparison with an amplifier based on a prior art.

FIG. 9 is a diagram showing a simulation result of the IIP2 characteristic for the TFC-LNA 50 of the second embodiment (FIG. 7), wherein the axis of abscissas represents a frequency (MHz), and the axis of ordinates represents an IIP2 (dBm).

In the simulation of the IIP2 characteristic for the TFC-LNA 50 of the second embodiment (FIG. 7), the direct current output from the variable current source 51 is set to 2 mA, while the output voltage of the voltage source DCS2 is set to 4 V, and two tone signals having the same specifications as those of the case of measuring the IIP3 characteristic. FIG. 9 also shows a result of simulating the IIP2 characteristic of the TFC-LNA 50 when the direct current output from the variable current source 51 as well as the output voltage of the voltage source DCS2 is set to 12 mA and 10 V, respectively, together with the IIP2 characteristic when they are set to 2 mA and 4 V, respectively. As shown in FIG. 9, when the power consumption of the TFC-LNA 50 is reduced by about 112 mW, the value of the IIP2 characteristic decreases by 10 dBm or so at, for example, a band less than or equal to 100 MHz in comparison with the case of the maximum power consumption (12 mA, 10 V), but the IIP2 characteristic of greater than or equal to +40 dBm is acquired at a band less than or equal to 100 MHz in case of the minimum power consumption (2 mA, 4 V), so that the TFC-LNA 50 is adequately practical.

Figure 10A:
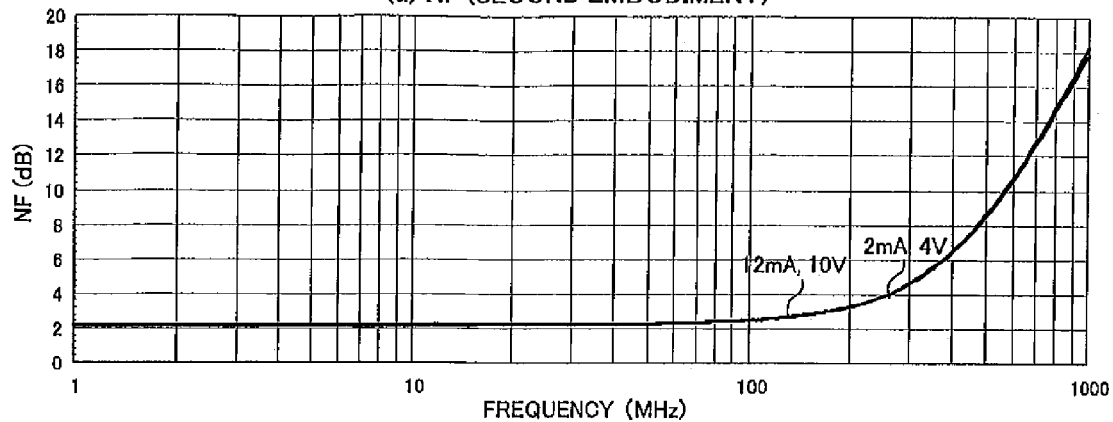
FIGS. 10A, 10B and 10C are diagrams showing simulation results of a noise factor (NF), a reflection coefficient ($S_{11}$), and a permeability coefficient ($S_{21}$) for the TFC-LNA of the second embodiment.
Figure 10B:
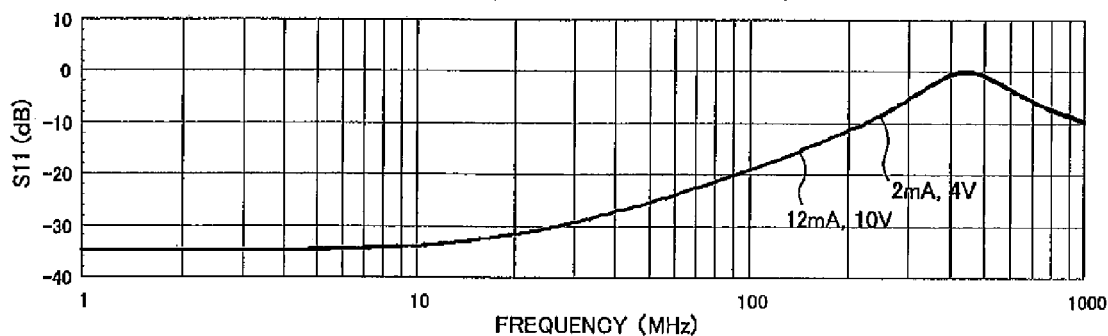
Figure 10C:
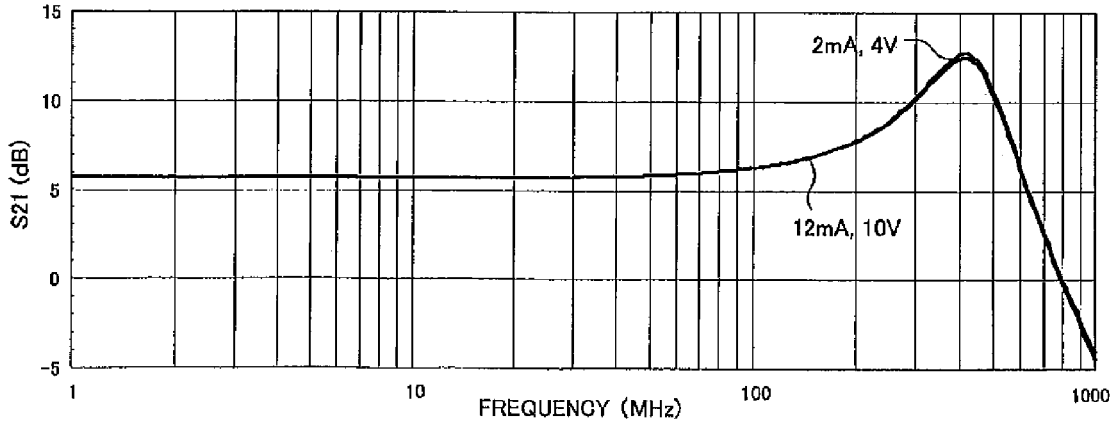

FIGS. 10A to 10C are diagrams showing the simulation results of the noise factor (NF), reflection coefficient ($S_{11}$), and permeability coefficient ($S_{21}$) of the TFC-LNA 50 of the second embodiment (FIG. 7), respectively.

FIGS. 10A to 10C show the respective simulation results of the noise factor (NF), reflection coefficient ($S_{11}$), and permeability coefficient ($S_{21}$) of the TFC-LNA 50 of the second embodiment (FIG. 7) when the direct current output from the variable current source 51 as well as the output voltage of the voltage source DCS2 are set to 12 mA and 10 V, respectively, together with each of those characteristics when they are set to 2 mA and 4 V, for a band between 1 MHz and 1 GHz. In observing the respective characteristics shown in FIGS. 10A to 10C, there is almost no effect that the output current of the variable current source 51 as well as the output voltage of the voltage source DCS2 are changed from 12 mA and 10 V, to 2 mA and 4 V, respectively, and it becomes apparent that the operating current and the collector voltage of the transistor 31 of the emitter follower do not affect the small signal characteristics of the TFC-LNA 50.

Figure 11:
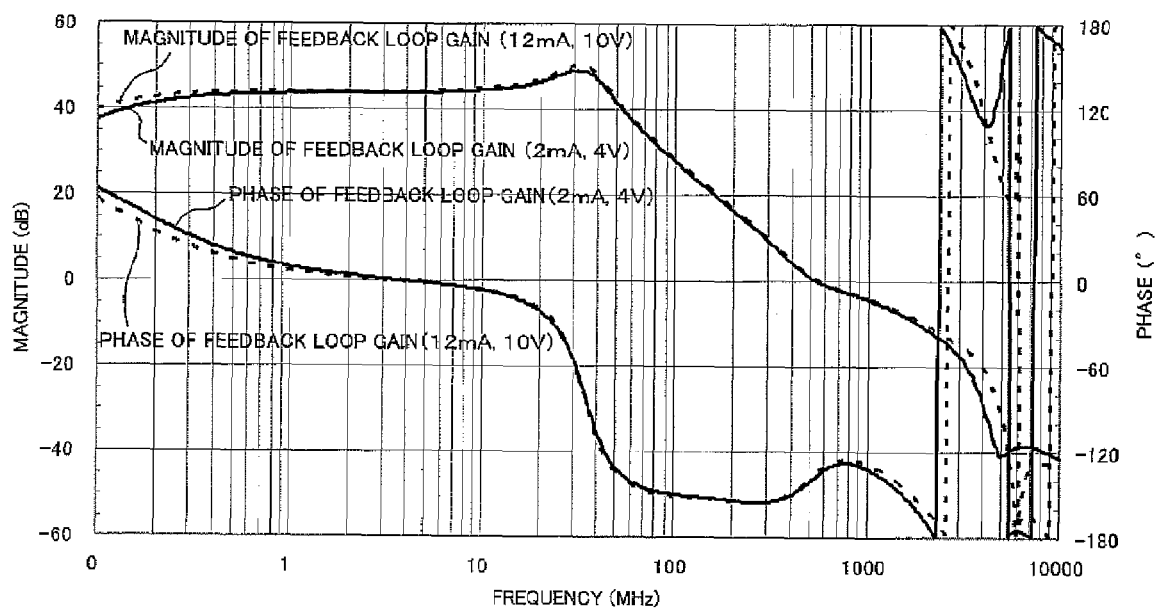
FIG. 11 is a diagram showing a simulation result of a feedback loop gain for the TFC-LNA of the second embodiment.

FIG. 11 is a diagram showing the simulation result of the feedback loop gain for the TFC-LNA 50 of the second embodiment (FIG. 7).

FIG. 11 is a Bode plot showing a result of measuring the feedback loop gain of the TFC-LNA 50 of the second embodiment (FIG. 7) measured at the base of the transistor 24 through a simulation when the direct current output from the variable current source 51 is set to 2 mA, and a result of the same characteristic when the direct current output from the variable current source 51 as well as the output voltage of the voltage source DCS2 are set to 12 mA and 10 V, respectively, together with the same characteristics when they are set to 2 mA and 4 V, for a band between 0.1 MHz and 10 GHz. In observing the frequency characteristics of magnitude and phase of the feedback loop-gain, both shown in FIG. 11, the result for a lower power consumption case (2 mA, 4 V) almost perfectly coincide with the other result for a higher power consumption case (12 mA, 10 V), at a frequency of 1 GHz or under. This indicates that the same level of stability can be maintained by the same phase compensation circuit having a fixed circuit constant even if the dynamic range of the TFC-LNA 50 of the second embodiment is increased or decreased by changing the operating current as well as the collector voltage of the transistor 31 of the emitter follower.

Third Embodiment

Figure 12:
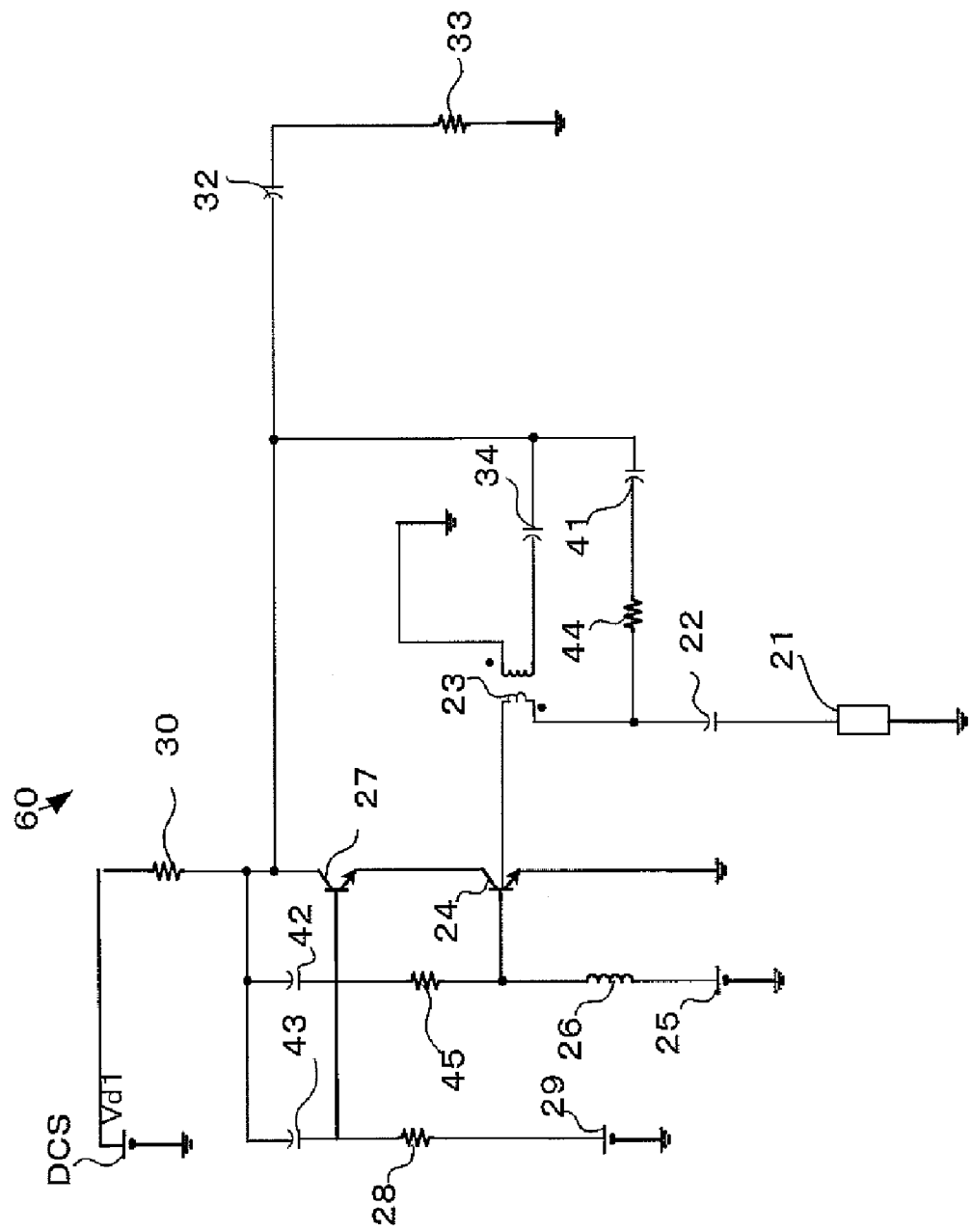
FIG. 12 is a circuit diagram showing a TFC-LNA according to the third embodiment of the invention.

FIG. 12 is a diagram showing a TFC-LNA 60 according to the third embodiment of the invention.

The TFC-LNA 60 of this embodiment is equivalent to the TFC-LNA 20 of the first embodiment where the transistor 31, constituting the emitter follower, the transistors 35, 37, and 38, constituting the current mirror, the resistors 36, 40, and the current source 39 are eliminated, and the collector of the transistor 27, i.e., the output node of the cascode amplifier is caused to directly function as the output terminal of the TFC-LNA 60. The output terminal of the TFC-LNA 60 is connected to an output load 33 through a coupling capacitor 32, and is further connected to the secondary winding of the transformer 23, which constitutes a first negative feedback path, through the coupling capacitor 34, and to the resistor 44, which constitutes a second negative feedback path, through the coupling capacitor 41. The other structural portions of the TFC-LNA 60 are same as those of the TFC-LNA 20 of the first embodiment.

Eliminating the transistor 31 constituting the emitter follower, the transistors 35, 37, and 38 constituting the current mirror and the direct-current source 39 enables the TFC-LNA 60 to further reduce the power consumption thereof. It is expected that the TFC-LNA 60 has a deteriorated distortion characteristic in comparison with the TFC-LNA 20 in compensation for the reduction of the power consumption, but such a TFC-LNA 60 can be used for an application where a high dynamic range is not required or a low current consumption is required.

Fourth Embodiment

Figure 13:
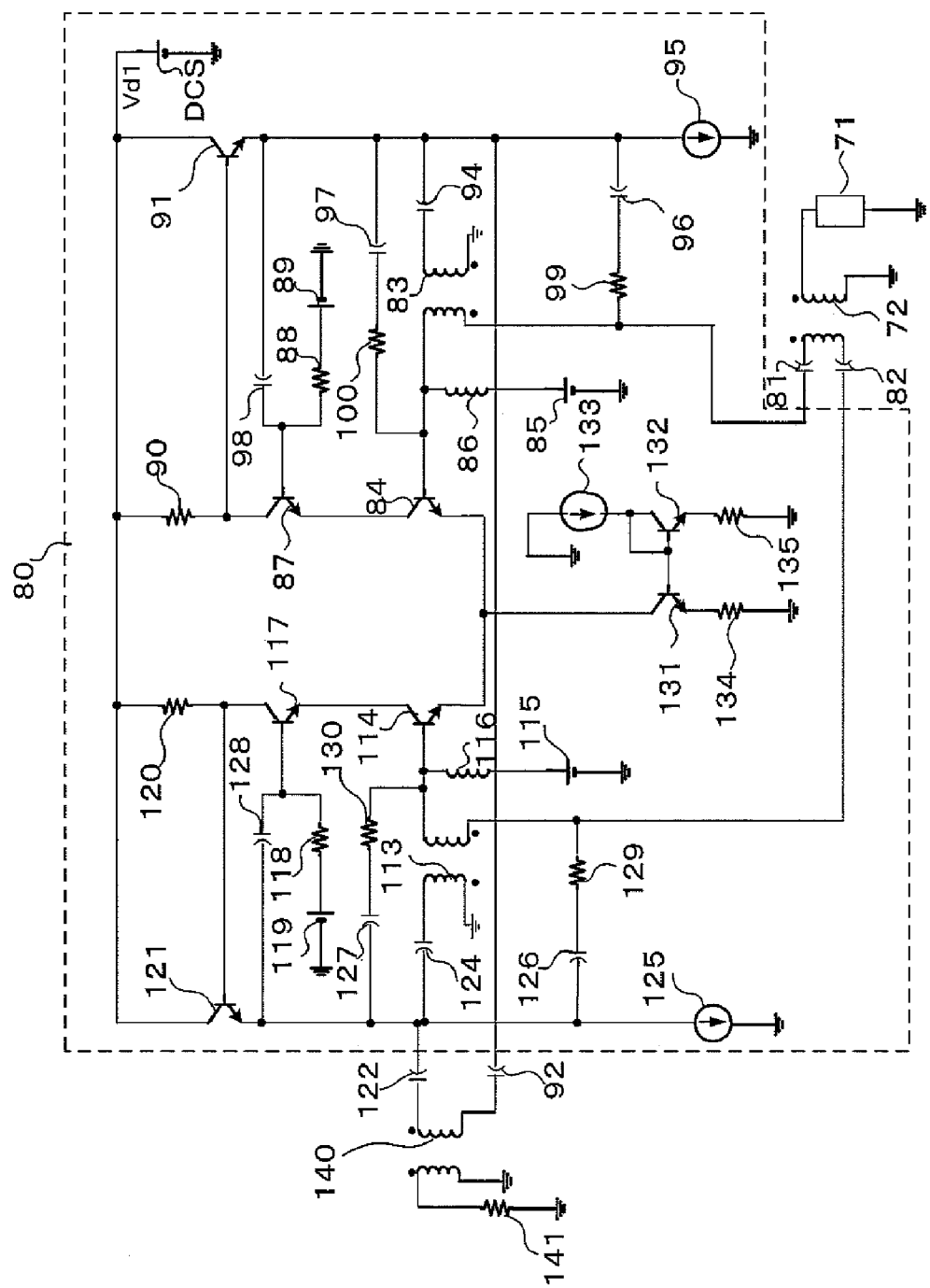
FIG. 13 is a circuit diagram showing a differential TFC-LNA according to the fourth embodiment of the invention.

FIG. 13 is a diagram showing a differential TFC-LNA 80 according to the fourth embodiment of the invention.

In the foregoing first to third embodiments, the TFC-LNAs 20, 50, and 60 which amplify a single-phase input signal have been explained, but the differential TFC-LNA 80 of the embodiment employs a structure such that two TFC-LNAs each having a stable feedback loop gain are embedded, and is a differential amplifier which amplifies a differential input signal, and outputs a differential amplified signal. The differential TFC-LNA 80 comprises two symmetrical amplifiers having the common circuit constant. In FIG. 13, the right amplifier of the differential TFC-LNA 80 includes transistors 84, 87, and 91, and the left amplifier includes transistors 114, 117, and 121. The right and left amplifiers of the differential TFC-LNA 80 have individual input/output terminals, and a node between a resistor 99 and the primary winding of a transformer 83 serves as the input terminal of the right amplifier, a node between a resistor 129 and the primary winding of a transformer 113 serves as the input terminal of the left amplifier, the emitter of the transistor 91 serves as the output terminal of the right amplifier, and the emitter of the transistor 121 serves as the output terminal of the left amplifier.

According to the differential TFC-LNA 80, a signal source 71 having an output impedance of 50Ω is connected to the hot side of the primary winding of a balun transformer 72. The cold side of the primary winding of the balun transformer 72 is grounded. Both ends of the secondary winding of the balun transformer 72 are connected to the right and left input terminals of the differential TFC-LNA 80 through coupling capacitors 81, 82, respectively. The balun transformer 72 converts an input signal to a differential signal, and the turn ratio thereof between the primary winding and the secondary winding is, for example, 1:1.

The other electrode of the capacitor 81 is connected to the hot side of the primary winding of the transformer 83. A commercially-available transformer having a turn ratio of, for example, 1:2 is used as the transformer 83.

The cold side of the transformer 83 is connected to the base of the NPN transistor 84. The base of the transistor 84 is connected to the positive electrode of a biasing voltage source 85 through a choke coil 86.

The collector of the transistor 84 is connected to the emitter of the NPN transistor 87. The base of the transistor 87 is connected to the positive electrode of a biasing voltage source 89 through a phase compensation resistor 88. The resistor 88 works together with a capacitor 98 to be discussed later, and constitutes a first phase compensation circuit of the fourth embodiment for performing a phase compensation for the right amplifier of the differential TFC-LNA 80. The negative electrode of the biasing voltage source 89 is grounded.

The transistor 84 and the transistor 87 are connected together in a cascode connection manner, and constitute a cascode amplifier having a resistor 90 as a load. The collector of the transistor 87 is connected to the one end of the resistor 90. A direct-current supply voltage Vd1 is applied to the other end.

The node between the resistor 90 and the collector of the transistor 87 serves as the output node for outputting an amplified voltage signal of the cascode amplifier, and is connected to the base of the NPN transistor 91, i.e., the input terminal of the emitter follower. The transistor 91 and a constant current source 95 constitute an emitter follower, and operate as the output buffer of the right amplifier of the differential TFC-LNA 80. The direct-current supply voltage Vd1 is applied to the collector of the transistor 91. The emitter of the transistor 91 is connected to one electrode of a coupling capacitor 92.

The right output terminal of the differential TFC-LNA 80. i.e., the emitter of the transistor 91 is connected to the cold side of the secondary winding of the transformer 83 through a coupling capacitor 94. An output voltage signal applied to the secondary winding of the transformer 83 is transmitted to the primary side of the transformer 83 by electromagnetic coupling, and is series-mixed with an input signal. This constitutes the first negative feedback path of the differential TFC-LNA 80 of the fourth embodiment. The emitter of the transistor 91 is connected to a constant current source 95 for supplying an operating current for the emitter follower. The current source 95 may comprise a current mirror circuit.

The emitter of the transistor 91 is further connected to one electrode of a coupling capacitor 96, one electrode of a phase compensation capacitor 97, and one electrode of the phase compensation capacitor 98.

The resistor 99 and the coupling capacitor 96 are connected in series between the right output terminal of the differential TFC-LNA 80 and the hot side of the primary winding of the transformer 83, i.e., the right signal input terminal of the differential TFC-LNA 80, and function in such a way that an output signal is shunt-mixed with an input signal. This constitutes the second feedback path of the TFC-LNA 80 of the fourth embodiment.

The capacitor 97 and a resistor 100 constitute the second phase compensation circuit of the fourth embodiment which performs phase compensation for the right amplifier of the differential TFC-LNA 80.

On the other hand, the other electrode of the capacitor 82 is connected to the hot side of the primary winding of the transformer 113. A commercially-available transformer having a turn ratio of, for example, 1:2 is used as the transformer 113.

The cold side of the primary winding of the transformer 113 is connected to the base of the transistor 114. The base of the transistor 114 is further connected to the positive electrode of a biasing voltage source 115 through a choke coil 116.

The collector of the transistor 114 is connected to the emitter of the NPN transistor 117. The base of the transistor 117 is connected to the positive electrode of a biasing voltage source 119 through a resistor 118. The resistor 118 works together with a capacitor 128 to be discussed later, and constitute the third phase compensation circuit of the fourth embodiment which performs phase compensation for the left amplifier of the differential TFC-LNA 80. The negative electrode of the biasing voltage source 119 is grounded.

The transistor 114 and the transistor 117 are connected together in a cascode connection manner, and constitute a cascode amplifier having a resistor 120 as a load. The collector of the transistor 117 is connected to one end of the resistor 120. The direct-current-power-source voltage Vd1 is applied to the other end of the resistor 120.

The node between the resistor 120 and the collector of the transistor 117 functions as an output node for outputting an amplified voltage signal of the cascode amplifier, and is connected to the base of the NPN transistor 121, i.e., the input terminal of an emitter follower. The transistor 121 and a constant current source 125 constitute the emitter follower, and function as the output buffer of the left amplifier of the differential TFC-LNA 80. The direct-current-power-source voltage Vd1 is applied to the collector of the transistor 121. The emitter of the transistor 121 is connected to one electrode of a capacitor 122.

The left output terminal of the differential TFC-LNA 80, i.e., the emitter of the transistor 121 is connected to the cold side of the secondary winding of the transformer 113 through a coupling capacitor 124. An output voltage signal applied to the secondary winding of the transformer 113 is transmitted to the primary side of the transformer 113 by electromagnetic coupling, and is series-mixed with an input signal. This constitutes the third feedback path of the differential TFC-LNA 80 of the fourth embodiment.

The emitter of the transistor 121 is connected to a constant current source 125 for supplying an operating current for the emitter follower. The current source 125 may comprise a current mirror circuit.

The emitter of the transistor 121 is further connected to one electrode of a coupling capacitor 126, one electrode of a phase compensation capacitor 127, and one electrode of a phase compensation capacitor 128.

The resistor 129 and the coupling capacitor 126 are connected in series between the left output terminal of the differential TFC-LNA 80 and the hot side of the primary winding of the transformer 113, i.e., the left signal input terminal of the differential TFC-LNA 80, and function in such a way that an output signal is shunt-mixed with an input signal. This constitutes the fourth negative feedback path of the differential TFC-LNA 80 of the fourth embodiment.

The capacitor 127 and a resistor 130 constitute the fourth phase compensation circuit of the fourth embodiment for performing phase compensation for the left amplifier of the TFC-LNA 80.

The emitters of the transistors 84, 114 are connected to the collector of an NPN transistor 131. The base of the transistor 131 is connected to the base and collector of an NPN transistor 132, and the transistors 131, 132 constitute a current mirror circuit.

The collector of the transistor 132 is connected to a constant current source 133. The emitter of the transistor 131 is grounded through a resistor 134. The emitter of the transistor 132 is grounded through a resistor 135. The collector current of the transistor 131 is so controlled by the constant current source 133 as to be always constant, so that the right and left amplifiers of the differential TFC-LNA 80 operate in association with each other in such a way that their output signals are brought into balance, having an unchanging sum.

The emitter terminal of the transistor 91 of the one emitter follower and the emitter terminal of the transistor 121 of the other emitter follower serve as a pair of differential output terminals of the differential TFC-LNA 80, and those output terminals are connected to both ends of the primary winding of a balun transformer 140 through the coupling capacitors 92, 122. A load 141 of, for example, 5 kΩ is connected to the hot side of the secondary winding of the balun transformer 140.

According to the fourth embodiment, a single-phase input signal is converted to a differential input signal by the balun transformer 72, and is input to the differential TFC-LNA 80, and a differential amplified output signal of the differential TFC-LNA 80 is converted to a single-phase output signal by the balun transformer 140, and is applied to the load 141. The turn ratio of the balun transformer 140 is, for example, 1:1.

According to the differential cascode amplifier, in general, upper stage transistors of the cascode amplifier, i.e., transistors corresponding to the transistors 87, 117 have respective base terminals grounded in the small-signal sense. On the other hand, as explained above, according to the differential TFC-LNA 80 of the fourth embodiment, the base of the transistor 87 is connected to the first phase compensation circuit comprising the capacitor 98 and the resistor 88, and the base of the transistor 117 is connected to the third phase compensation circuit comprising the capacitor 128 and the resistor 118, and further, the second phase compensation circuit comprising the capacitor 97 and the resistor 100 is connected between the output terminal of the right amplifier of the differential TFC-LNA 80 and the input terminal thereof, and the fourth phase compensation circuit comprising the capacitor 127 and the resistor 130 is connected between the output terminal of the left amplifier of the differential TFC-LNA 80 and the input terminal thereof. Those phase compensation circuits stabilize the differential TFC-LNA 80.

The voltage gain of the differential TFC-LNA 80 is ideally given by the turn ratio N of the transformer 83 and that of the transformer 113. According to the differential TFC-LNA 80 of the fourth embodiment (FIG. 13), commercially-available transformers having a turn ratio of 1:2 are used, so that the voltage gain is about 6 dB. The differential input impedance of the differential TFC-LNA 80 is ideally given by the foregoing turn ratio N and the resistance value of the feedback resistors 99, 129, i.e., 2R/(N+1).

According to the differential TFC-LNA 80 of the fourth embodiment (FIG. 13), the feedback resistance value R is set to 75Ω in such a way that the differential input impedance becomes 50Ω which is a typical signal-source impedance value.

Fifth Embodiment

Figure 19:
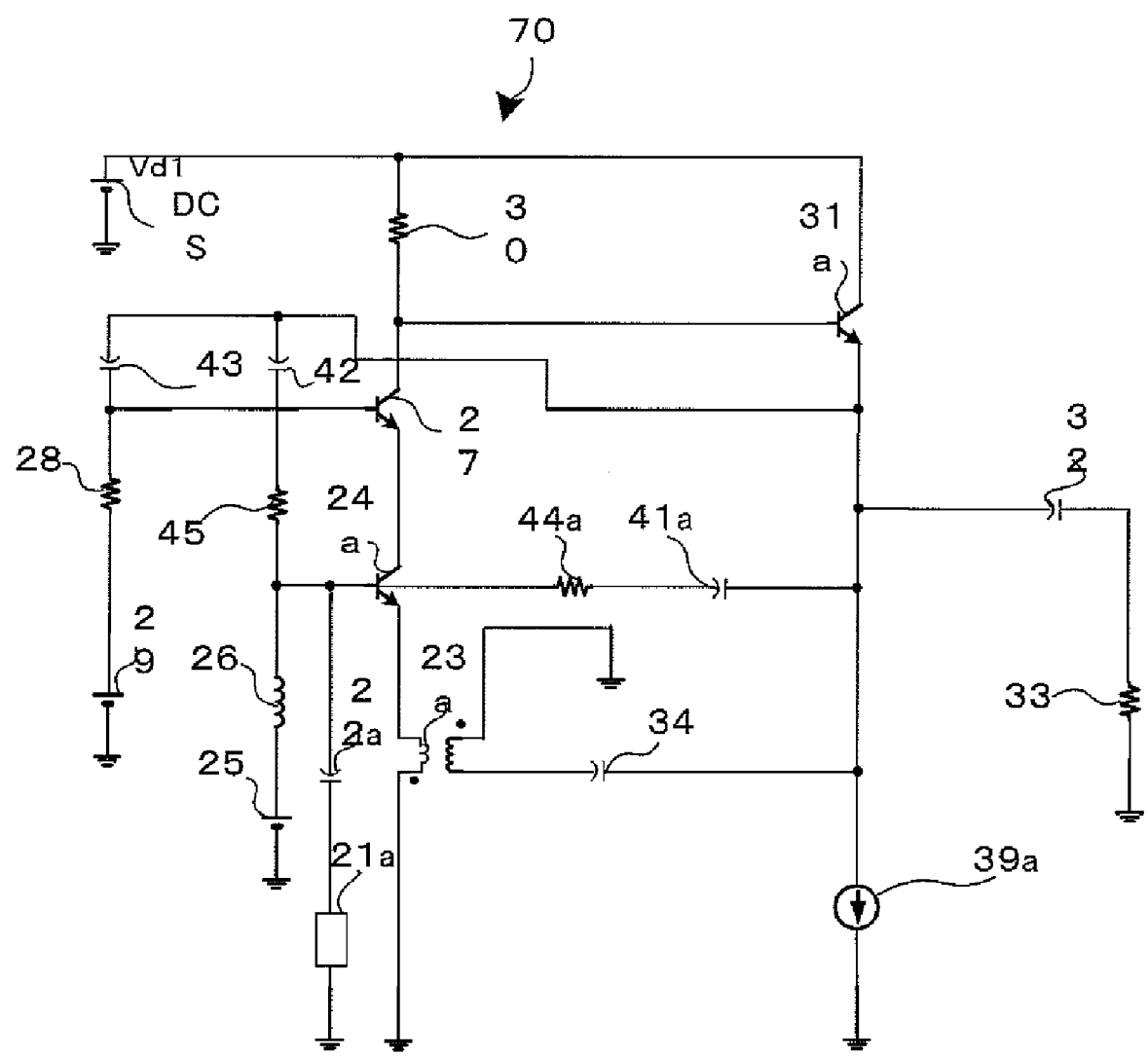
FIG. 19 is a circuit diagram showing a TFC-LNA according to the fifth embodiment of the invention.

FIG. 19 is a diagram showing a TFC-LNA 70 according to the fifth embodiment of the invention.

The TFC-LNA 70 is one that the primary winding of the transformer 23, connected in series between the base of the input transistor 24 and the signal input terminal of the TFC-LNA 20 of the first embodiment (see, FIG. 1), is modified as to be connected in series between the emitter of the input transistor 24 and the ground. The hot-side terminal of the primary winding of the feedback transformer 23a is grounded in such a way that the sum of the feedback voltage induced in the primary winding of the feedback transformer 23a and the base-emitter voltage of the input transistor 24a in the TFC-LNA 70, which is equal to the voltage applied to the signal input terminal of the TFC-LNA 70, may coincide with the sum of the equivalent voltages in the TFC-LNA 20. Consequently the same voltage as in the base-emitter of the input transistor 24 in the TFC-LNA 20 of the first embodiment, may be caused in the base-emitter of the input transistor 24a in the TFC-LNA 70 of the fifth embodiment, under an identical operational condition, enabling the TFC-LNA 70 to have the same amplifier characteristics as the TFC-LNA 20, in an ideal case.

For brevity, the operating current of the emitter follower in the TFC-LNA 70 of the fifth embodiment is given by a current source 39a, while the equivalent current is provided by a current mirror in the TFC-LNA 20 of the first embodiment.

The output terminal of the TFC-LNA 70, i.e. the emitter of the transistor 31a, is connected to one end of a feedback resistor 44a, through a coupling capacitor 41a. The other end of the resistor 44a is connected to the base of the NPN transistor 24a. The base of the transistor 24a is further connected to a signal source 21a having an output impedance R of 50Ω through a coupling capacitor 22a.

Note that the signal source 21a, the capacitors 22a, 41a, the current source 39a, and the resistor 44a have the same structures as those of the respective signal source 21, capacitors 22, 41, current source 39, and resistor 44 of the first embodiment.

The other structural portions of the TFC-LNA 70 are same as those of the TFC-LNA 20 of the first embodiment (FIG. 1).

Like the first embodiment, by disposing phase compensation circuits each comprising a resistor and a capacitor between the output terminal of the emitter follower and the base of the upper-stage transistor, and between the output terminal of the emitter follower and the base of the input transistor, the TFC-LNA 70 can perform a stable negative feedback operation. Like the TFC-LNA 20 of the first embodiment, the TFC-LNA 70 of the fifth embodiment can realize a high-dynamic-range wideband low noise amplifier. Furthermore, the TFC-LNA 70 of the fifth embodiment can reduce the total watt-hour consumption by dynamically changing the operating current and the collector voltage of the emitter follower likewise the TFC-LNA 50 of the second embodiment.

The present invention is not limited to the foregoing first to fifth embodiments, and can be changed and modified in various forms.

For example, according to the first to fifth embodiments, each transistor comprises a bipolar transistor, but may comprise a MOS transistor, or a combination of a bipolar transistor and a MOS transistor.

According to the differential TFC-LNA 80 of the fourth embodiment, the operating current of the transistor 91 and that of the transistor 121, both constituting an emitter follower, are fixed and supplied from the constant current sources 95, 125, but like the TFC-LNA 50 of the second embodiment, those operating currents may be variable. The collector voltage of the transistor 91 and that of the transistor 121 may be variable likewise.

Like the TFC-LNA 60 of the third embodiment, the output buffer, i.e., the emitter follower may be omitted, and the collector of the transistor 87 and that of the transistor 117 may be directly used as differential output terminals. Such a modification enables the differential TFC-LNA to reduce the power consumption thereof.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2007-284566 filed on Oct. 31, 2007 and including specification, claims, drawings and summary. The disclosure of the above Japanese Patent Application is incorporated herein by reference in its entirety.

What is claimed is:

1. A low noise amplifier comprising:
    a transformer having a primary winding whose one end is connected to a signal input terminal to which an input signal is applied, and a secondary winding electromagnetically coupled to the primary winding;
    an input-stage transistor having a control electrode, a first conduction electrode and a second conduction electrode, the first and second conduction electrodes changing a conduction state by the control electrode, and the control electrode being connected to a terminal of the primary winding other than the terminal connected to the signal input terminal;
    an upper-stage transistor having a control electrode, a first conduction electrode and a second conduction electrode, the first and second conduction electrodes changing a conduction state by the control electrode, the second conduction electrode being connected to a load device, and the first conduction electrode being connected to the second conduction electrode of the input-stage transistor so that the upper-stage transistor is connected to the input-stage transistor in a cascode connection manner, thereby enhancing an output impedance;
    an amplification-result transmission circuit providing an amplification result of the input signal to an output node;
    a first negative feedback circuit applying an amplification result of the input signal on the output node to the secondary winding;
    a second negative feedback circuit connected between the output node and the signal input terminal;
    a first phase compensation circuit connected to the output node and the control electrode of the upper-stage transistor; and
    a second phase compensation circuit connected to the output node and the control electrode of the input-stage transistor.

2. The low noise amplifier according to claim 1, wherein the amplification-result transmission circuit has an emitter follower or a source follower connected to the second conduction electrode of the upper-stage transistor, and a signal output from the emitter follower or the source follower is applied to the output node as an amplification result of the input signal.

3. The low noise amplifier according to claim 2, further comprising a consumption current adjustment unit which supplies a variable current flowing to the emitter follower or the source follower.

4. A differential amplifier comprising:
a first transformer having a primary winding whose one end is connected to a first signal input terminal to which a first input signal is applied, and a secondary winding electromagnetically coupled to the primary winding;
a first input-stage transistor having a control electrode, a first conduction electrode and a second conduction electrode, the first and second conduction electrodes changing a conduction state by the control electrode, and the control electrode being connected to a terminal of the primary winding of the first transformer other than the terminal connected to the first signal input terminal;
a first upper-stage transistor having a control electrode, a first conduction electrode and a second conduction electrode, the first and second conduction electrodes changing a conduction state by the control electrode, the second conduction electrode being connected to a first load device, and the first conduction electrode being connected to the second conduction electrode of the first input-stage transistor so that the first upper-stage transistor is connected to the first input-stage transistor in a cascode connection manner, thereby enhancing an output impedance;
a first amplification-result transmission circuit providing an amplification result of the first input signal to a first output node;
a first negative feedback circuit applying an amplification result of the first input signal on the first output node to the secondary winding of the first transformer;
a second negative feedback circuit connected between the first output node and the first signal input terminal;
a second transformer having a primary winding whose one end is connected to a second signal input terminal to which a second input signal is applied, and a secondary winding electromagnetically coupled to the primary winding;
a second input-stage transistor having a control electrode, a first conduction electrode and a second conduction electrode, the first and second conduction electrodes changing a conduction state by the control electrode, and the control electrode being connected to a terminal of the primary winding of the second transformer other than the terminal connected to the second signal input terminal;
a second upper-stage transistor having a control electrode, a first conduction electrode and a second conduction electrode, the first and second conduction electrodes changing a conduction state by the control electrode, the second conduction electrode being connected to a second load device, and the first conduction electrode being connected to the second conduction electrode of the second input-stage transistor so that the second upper-stage transistor is connected to the second input-stage transistor in a cascode connection manner, thereby enhancing an output impedance;
a second amplification-result transmission circuit providing an amplification result of the second input signal to a second output node;
a third negative feedback circuit applying an amplification result of the second input signal on the second output node to the secondary winding of the second transformer;
a fourth negative feedback circuit connected between the second output node and the second signal input terminal;
a constant current circuit connected to a current path, including the first input-stage transistor, the first upper-stage transistor and the first load device, and a current path, including the second input-stage transistor, the second upper-stage transistor, and the second load device;
a first phase compensation circuit connected to the first output node and the control electrode of the first upper-stage transistor;
a second phase compensation circuit connected to the first output node and the control electrode of the first input-stage transistor;
a third phase compensation circuit connected to the second output node and the control electrode of the second upper-stage transistor; and
a fourth phase compensation circuit connected to the second output node and the control electrode of the second input-stage transistor.

5. The differential amplifier according to claim 4, wherein the first amplification-result transmission circuit has a first emitter follower or a first source follower connected to the second conduction electrode of the first upper-stage transistor, and a signal output from the first emitter follower or the first source follower is applied to the first output node as an amplification result of the first input signal, and
the second amplification-result transmission circuit has a second emitter follower or a second source follower connected to the second conduction electrode of the second upper-stage transistor, and a signal output from the second emitter follower or the second source follower is applied to the second output node as an amplification result of the second input signal.

6. The differential amplifier according to claim 5, further comprising a consumption current adjustment unit which supplies a variable current flowing to the first emitter follower or the first source follower, and a variable current flowing to the second emitter follower or the second source follower.

7. A low noise amplifier comprising:
a signal input terminal to which an input signal is applied;
a transformer having a primary winding whose one end is grounded, and a secondary winding electromagnetically coupled to the primary winding;
an input-stage transistor having a control electrode, a first conduction electrode, and a second conduction electrode, the first and second conduction electrodes changing a conduction state by the control electrode, the control electrode being connected to the signal input terminal, and the first conduction electrode being connected to a terminal of the primary winding other than the terminal grounded;
an upper-stage transistor having a control electrode, a first conduction electrode and a second conduction electrode, the first and second conduction electrodes changing a conduction state by the control electrode, the second conduction electrode being connected to a load device, the first conduction electrode being connected to the second conduction electrode of the input-stage transistor so that the upper-stage transistor is connected to the input-stage transistor in a cascode connection manner, thereby enhancing an output impedance;

an amplification-result transmission circuit providing an amplification result of the input signal to an output node;
a first negative feedback circuit applying an amplification result of the input signal on the output node to the secondary winding;
a second negative feedback circuit connected between the output node and the control electrode of the input-stage transistor;

a first phase compensation circuit connected to the output node and the control electrode of the upper-stage transistor; and
a second phase compensation circuit connected to the output node and the control electrode of the input-stage transistor.

* * * * *